(12) United States Patent
Lazarev

(10) Patent No.: US 8,222,074 B2
(45) Date of Patent: Jul. 17, 2012

(54) ANISOTROPIC SEMICONDUCTOR FILM AND METHOD OF PRODUCTION THEREOF

(75) Inventor: Pavel I. Lazarev, Menlo Park, CA (US)

(73) Assignee: Carben Semicon Limited, Nicosia (CY)

( * ) Notice: Subject to any disclaimer, the term of this patent is extended or adjusted under 35 U.S.C. 154(b) by 0 days.

(21) Appl. No.: 13/355,445

(22) Filed: Jan. 20, 2012

(65) Prior Publication Data

US 2012/0122274 A1 May 17, 2012

Related U.S. Application Data

(62) Division of application No. 12/513,408, filed on May 4, 2009, now Pat. No. 8,124,966.

(30) Foreign Application Priority Data

Nov. 6, 2006 (GB) .................................. 0622150.1

(51) Int. Cl.
*H01L 51/40* (2006.01)

(52) U.S. Cl. .................... 438/99; 438/502; 257/E21.114
(58) Field of Classification Search .................... 438/99, 438/502; 257/E21.114
See application file for complete search history.

(56) References Cited

U.S. PATENT DOCUMENTS

| 4,016,247 A | 4/1977 | Otani et al. |
| 2006/0065888 A1* | 3/2006 | Lazarev .......................... 257/40 |
| 2007/0053168 A1 | 3/2007 | Sayir et al. |

OTHER PUBLICATIONS

Chan et al., "Liquid crystal engineering of carbon nanofibers and nanotubes," Carbon 43, 2005, pp. 2341-2440.
Sousa et al., "Patterning lyotropic liquid crystals as precursors for carbon nanotube arrays," Applied Physics Letters, 87, 2005, p. 173115.
Berger et al., "Ultrathin epitaxial graphite: 2D electron gas properties and a route toward graphene-based nanoelectronics," School of Physics, Georgia Inst. of Technology, Atlanta, GA, Oct. 7, 2004, 5 pages.
Dosa et al., "Isomerization of Linear to Angular [3]Phenylene and PAHs Under Flash Vacuum Pyrolysis Conditions," Org. Lett. 3, 2001, p. 1017.
Piao et al., "Mechanism of Enhancemen of Conductivity for Pyrolyzed Polypyrrolone Film at High Temperature," J. of Polymer Science: Part A: Polymer Chemistry, vol. 34, 1996, pp. 1567-1572.
Kuper et al., "A New Method of Doping Pyrolytic Graphite Utilizing Laser heating in the Presence of Organic Heteroatomic Vapors," Chem. Mater., vol. 11, 1999, pp. 408-411.
Kim et al. "Atomic structure of highly ordered pyrolytic graphite doped with boron," Electrochemistry Communications, vol. 3, 2001, pp. 608-612.
Murthy et al., "X-ray diffraction evidence for the formation of a discotic phase during graphitization," Carbon, vol. 39, No. 6, May 2001, pp. 809-813.

(Continued)

*Primary Examiner* — Trung Q Dang
(74) *Attorney, Agent, or Firm* — Houst Consulting

(57) ABSTRACT

The present invention relates generally to the field of macro- and microelectronics with the potential for large-scale integration, optics, communications, and computer technology and particularly to the materials for these and other related fields. The present invention provides an anisotropic semiconductor film on a substrate, comprising at least one solid layer of material that comprises predominantly planar graphene-like carbon-based structures and possesses anisotropy of conductivity, and wherein the layer thickness is in a range from approximately 5 nm to 1000 nm.

27 Claims, 19 Drawing Sheets

OTHER PUBLICATIONS

Khokhlov etal., "Ribtan—a new graphene-based material for electronics," Proceedings of OSC'08, Frankfurt, Germany, 2008, 4 pages.
Geim et al., "The rise of grapheme," Nature Materials, vol. 6, Mar. 2007, pp. 183-191.
Sousa et al. "Novel Carbon Nanotubes Based on Disk-Rod Assemblies of Lyotropic Liquid Crystals," Mol. Cryst. Liq. Cryst., vol. 435, 2005, pp. 107[767]-116[776].
Chan et al., "Liquid crystal engineering of carbon nanofibers ar c nanotubes," Carbon 43, 2005, pp. 2341-2440.
Sousa et al., "Patterning lyotropic crystals as precursors for carbon nanotube arrays," Applied Physics Letters, 87, 2005, p. 173115.
Berger et al., "Ultrathin epitaxial graphite: 2D electron gas properties and a route toward graphine-based nanoelectronics," School of Physics, Georgia Inst. Of Technology, Atlanta, GA, Oct. 7, 2004, 5 pages.
Novoslov et al., "Electric Field Effect in Atomically Thin Carbon Films," Science, Oct. 22, 2004, 5 pages.
Gherghel et al., "Pyrolysis in the Mesophase: A Chemist's Approach towards preparing carbon Nano- and Microparticles," J. Am. Chem. Soc. 124, 2002, pp. 13130-13138.
Steinhart et al., "Polymer Nanotubes by Wetting of Ordered Porous Templates," Science 296, 2002, p. 1997.
Dosa et al., "Isomerization of Linear to Angular [3]Phenylene and PAHs Under Flash Cacuum Pyrolysis Conditions," Org. Lett. 3, 2001, p. 1017.
Jian et al., "Orientationally ordered and patterned discotic films and carbon films from liquid crystal precursors," Carbon 43, 2005, pp. 407-415.
Piao et al., "Mechanism of Enhacemen of Conductivity for Py olzed Polypyrrolone Film at High Temperature," J. of Polymer Science: Part A: Polymer Chemistry, vol. 34, 1996, pp. 1567-1572.
Setoguchi et al., "Infrared studies on hydrogen bond interaction in a homologues series of triphenylene discotic liquid crystals having carboxylic acids at the peripheral chains," Preparation and Characterization, Elsevier Sequoia, NL, vol. 438-439, Aug. 22, 2003, pp. 407-413.
Kuper et al., "A New Method of Doping Pyrolitic Graphite Utilizing Laser heating in the Presence of Organic Heteroatomic Vapors," Chem. Mater., vol. 11, 1999, pp. 408-411.
Kim et al., "Atomic structure of highly ordered pyrolytic graphite doped with boron," Electrochemistry Communications, vol. 3, 2001, pp. 608-612.
Kaplan et al., "Carbon films with relatively high conductivity," Applied Physics Letters, vol. 36, No. 10, May 15, 1980, pp. 867-869.
Murthy et al.,"X-ray diffraction evidence for the formation of a discotic phase during graphitization," Carbon, vol. 39, No. 6, May 2001, pp. 809-813.
Khokhlov etal., "Ribtan—a new graphene-based material for electronics," Proceedings of OSC'08, Frankfurt, German, 2008, 4 pages.
Song et al., "Nematic Liquid Crystallinity of Multiwall Carbon Nanotubes," Science, vol. 302, Nov. 21, 2003, p. 1363.
Geim et al., "The rise of grapheme," Nature Materials, vol. 6, Mar. 2007, ppp. 183-191.
Novoselov et al., "Two-dimensional atomic crystals," PNAS (Proceedings of the National Academy of Sciences of the USA), Jul. 26, 2005, vol. 102, No. 30, pp. 10451-10453.
Deheer et al., "Electronic Devices from Nano-patterned Epitaxial Graphite," NSF Nanoscale Science and Engineering Grantees Conference, Dec. 12-15, 2005, 3 pages.
Son et al., "Energy Gaps in Graphene Nanoribbons" arXiv:cond-mat/0611602v1, Nov. 23, 2006, 4 pages.
Son et al., "Half-metallic Graphene nanoribbons," Nature, vol. 444, Nov. 16, 2006, pp. 347-349.
PCT, International Search Report in PCT/GB2007/004223, Apr. 10, 2008, 4 pages.

* cited by examiner

ANISOTROPIC SEMICONDUCTOR FILM AND METHOD OF PRODUCTION THEREOF

This application is a division of U.S. patent application Ser. No. 12/513,408 filed May 4, 2009, the disclosure of which is incorporated herein by reference in its entirety.

The present invention relates generally to the field of macro- and microelectronics with the potential for large-scale integration, optics, communications, and computer technology and particularly to the materials for these and other related fields.

The development of modern technology requires creating new materials—in particular, carbon-based semiconductors—which serve as basis for fabricating optical, electronic, and other elements with desired properties such as a large number of interconnected electronic components (transistors, resistors, capacitors, etc) and arrays of thin film transistors for flat panel displays.

A special class of carbon-based semiconductors is represented by carbon nanotubes based on disk-rod assemblies of lyotropic liquid crystals, [see, e.g., Matthew E. Sousa, et al., Mol. Cryst. Liq. Cryst., Vol. 435, pp. 107/[767]-116/[776], 2005]. The carbon nanofibers and nanotubes have been fabricated using disk-rod assemblies of lyotropic liquid crystals in which the orientation of graphene layers can be manipulated using surface anchoring techniques common to liquid crystal displays. The bulk material properties of the carbon can be engineered by the spatial arrangement of the graphene layers due to their anisotropic nature. A patterning method of nanotube arrays using an automated printing technique has been demonstrated.

Four high-aspect-ratio carbon nanomaterials were fabricated by template-directed liquid crystal assembly and covalent capture [see, Christopher Chan et al., Carbon 43 (2005) 2431-2440]. By selecting from two different liquid crystal precursors (thermotropic mesophase, and lyotropic indanthrone disulfonate) and two different nanochannel template wall materials (alumina and pyrolytic carbon) both the shape of the nanocarbon and the graphene layer arrangement can be systematically engineered. The combination of AR mesophase and alumina channel walls gives platelet-symmetry nanofibers, whose basic crystal symmetry is maintained and perfected upon heat treatment at 2500° C. In contrast, AR infiltration into carbon-lined nanochannels produces unique C/C-composite nanofibers whose graphene planes lie parallel to the fiber axis. The transverse section of these composite nanofibers shows a planar polar structure with line defects. Use of solvated AR fractions or indanthrone disulfonate produces platelet-symmetry tubes, which are either cellular or fully hollow depending on solution concentration. The use of barium salt solutions to force precipitation of indanthrone disulfonate within the nanochannels yields continuous nanoribbons rather than tubes.

A simple patterning technique using lyotropic liquid crystal solutions to fabricate organized arrays of high aspect ratio carbon nanostructures has been reported [see, M. E. Sousa et al., Applied Physics Letters, 87, 173115, 2005]. An automated pen writing system is used in conjunction with nanochannel alumina templates to produce ordered arrays of nanotubes and nanofibers in a variety of shapes, widths, and carbon crystal structures set by surface anchoring phenomena. The nanostructure arrays are characterized with optical and electron microscopy and Raman spectroscopy to establish the morphology and crystal structures of the carbon nanoform arrays.

Ultrathin epitaxial graphite films which show remarkable 2D electron gas (2 DEG) behavior have been produced [see, Claire Berger et al., School of Physics, Georgia Institute of Technology, Atlanta, Ga. 30332-0430 (Dated: Oct. 7, 2004)]. The films, composed of typically 3 graphene sheets, were grown by thermal decomposition on the (0001) surface of 6H—SiC, and characterized by surface-science techniques. The low-temperature conductance spans a range of localization regimes according to the structural state (square resistance 1.5 kOhm/sq to 225 kOhm/sq at 4K, with positive magnetoconductance). Low resistance samples show characteristics of weak-localization in two dimensions, from which elastic and inelastic mean free paths were estimated. At low field, the Hall resistance is linear up to 4.5 T, which is well-explained by n-type carriers of density 1012 $cm^{-2}$ per graphene sheet. The most highly ordered sample exhibits Shubnikov-de Haas oscillations which correspond to nonlinearities observed in the Hall resistance, indicating a potential new quantum Hall system.

Mono-crystalline graphitic films were described [see K. S, Novoselov et al., "Electric Field Effect in Atomically Thin Carbon Films", *Science*, Oct. 22 (2004)] which are just a few atoms thick but nonetheless stable under ambient conditions, metallic and of high quality. The films are found to be a two-dimensional semimetal with a tiny overlap between valence and conductance bands and to exhibit a strong ambipolar electric-field effect such that electrons and holes in concentrations up to $10^{13}$ $cm^{-2}$ and with room temperature mobilities equal to 10,000 $cm^2/Vs$ can be induced by applying gate voltage.

The facile formation of ordered columnar superstructures from graphene molecules in the bulk state and their high stability in the mesophase qualify them as precursors toward novel carbon nanostructures. Therefore, pyrolysis under controlled conditions may maintain the order existing in the mesophase during the formation of the carbonaceous materials. Pitch, which is a mixture of graphitic molecules of different sizes, has been subjected to solid-state pyrolysis with and without templates, and carbon materials with partially graphitic structures may be obtained. Toward a better control of the order, the above well-defined graphene molecules were thus used in solid-state pyrolysis [see, Steinhart, M.; Zimmermann, S.; Goring, P.; Schaper, A. K.; Gosele, U.; Weder, C.; Wendorff, J. H. *Nano Lett.* 2005, 5, 429]. Pyrolysis of well-defined graphene molecules in the bulk state produced novel carbon nano- and microstructures [see, Gherghel, L.; Kubel, C.; Lieser, G.; Rader, H. J.; Mu^llen, K. *J. Am. Chem. Soc.* 2002, 124, 13130].]. Alkyl-substituted hexa-peri-hexabenzocoronene (HBC) was used as aromatic hydrocarbons in the referenced article. The flexible alkyl chains dramatically lower the melting points and induce the formation of extremely stable discotic mesophases with a columnar arrangement of the disk molecules. This enables the reducing of the temperature of graphitization and it is expected that, upon further increase of the temperature up to 800° C., the extended polycyclic aromatic hydrocarbon (PAH) structures would lead to the formation of graphitic structures The graphene molecules such as HBC-C12 were first heated in the mesophase to around 400° C., which resulted in the cleavage of alkyl chains while keeping the columnar superstructures, and then carbonized at higher temperature (max 800° C.), yielding larger graphitic nano- and microstructures. The temperatures are much lower than the normally used graphitization temperatures (2000-3000° C.). A template method may be also used to fabricate uniform carbon nanotubes by pyrolysis of graphitic molecules in porous alumina membranes. The graphene molecules were introduced into nanochannels within the alumina template by a simple wetting process [see, Steinhart, M.; Wendorff, J. H.;

Greiner, A.; Wehrspohn, R. B.; Nielsch, K.; Schilling, J.; Choi, J.; Gosele, U. *Science* 2002, 296, 1997] and then subjected to carbonization at various temperatures. During the wetting, the graphene molecules aligned along the channels and kept the order under the slow heating procedures. After the template was removed, uniform carbon nanotubes with ordered graphene orientations were obtained in a quantitative yield. The orientation of graphene layers is perpendicular to the tube axis due to the pre-organization of the disc-like molecules in the templates. This is different from the case of normal carbon nanotubes, in which the graphene layers are parallel to the tube axis. Such a template method was subsequently applied to the fabrication of other carbon nanotubes/nanorods using different polycyclic aromatic hydrocarbon (PAH) precursors. Instead of using graphitic discs in the alumina templates, two tetraphenylcyclopentadienone molecules with acetylene groups were filled into the nanochannels. Subsequent heating at low temperature (250-350° C.) resulted in hyperbranched polyphenylene nanotubes formed by Diels-Alder polymerization reactions between the cyclopentadienone units and the acetylene groups. Flash vacuum pyrolysis (FVP) of linear [3]phenylene affords its angular counterpart and the same mixture of polycyclic aromatic hydrocarbon isomers as that observed on FVP of angular [3]phenylene [see, Dosa, P. I.; Schleifenbaum, A.; Vollhardt, K. P. C., "Isomerization of Linear to Angular [3]Phenylene and PAHs Under Flash Vacuum Pyrolysis Conditions", *Org. Lett.* 2001, 3, 1017].

The techniques for fabricating novel organic and carbon films, in which liquid crystal surface anchoring and flow are exploited to precisely control molecular structure (in organic films) or crystal structure (in carbon films) are demonstrated in scientific and technical literature [see, Kengqing Jian, Haiqing Xianyu, James Eakin, Yuming Gao, Gregory P. Crawford, Robert H. Hurt, "Orientationally ordered and patterned discotic fims and carbon films from liquid crystal precursors", Carbon 43 (2005) 407-415]. Surface anchoring states were first measured for AR mesophase on spin-coatable organic resins, including commercial polyimide and photoresist. The thermotropic liquid crystal is AR-mesophase, whose surface anchoring states vary with substrate. These results were used to develop a lithographic technique for ordering AR surfaces in preprogrammed orientational micropatterns. AR was also processed into radial or star symmetry films by forced spreading combined with edge-on anchoring templates. Additional thin films were prepared from alternative liquid crystalline precursors composed of sulfonated polyaromatic dyes. These disk-like planar molecules undergo massive π-stacking in aqueous solution to form rod-like aggregates. At high concentrations or on surfaces, these rods or molecular columns align by repulsive interactions (lyotropic behavior), giving raise to a transverse alignment of the stacked poly-aromatic disks. Here the lyotropic dye indanthrone disulfonate is used to make fully dense ordered carbon films by spin coating or Meyer-bar (or Mayer rod) coating thin films on quartz followed by direct carbonization (without oxidative stabilization). These films exhibit surfaces rich in graphene edge-sites and are either anisotropic unidirectional (by bar coating) or multi-domain with long-range isotropy (by spin coating). Thus film properties (orientation of discotic molecules) depend on surface properties of a substrate. Two liquid crystalline precursors were used: the discotic naphthalene polymer, AR mesophase and the water-soluble lyotropic dye, indanthrone disulfonate.

The present application discloses films which can be patterned via conventional lithographic techniques, and electric field modulation of the film's conductance.

In a first aspect, the present invention provides an anisotropic semiconductor film on a substrate, comprising at least one solid layer of material comprising predominantly planar graphene-like carbon-based structures and possessing anisotropy of conductivity, wherein the layer thickness is in a range from 5 nm to 1000 nm, preferably from 10 nm to 1000 nm.

In a second aspect the present invention provides a method of producing an anisotropic semiconductor film, which involves following steps: (a) application on a substrate of a solution of one π-conjugated organic compound of the general structural formula I, or a combination of such organic compounds:

where CC is a predominantly planar carbon-conjugated core; A is an hetero-atomic; p is 0, 1, 2, 3, 4, 5, 6, 7, or 8; S and D are substituents, where S is a substituent providing a solubility of the organic compound and D is a substituent from a list comprising —NO$_2$, —Cl, —Br, —F, —CF$_3$, —CN, —OCH$_3$, —OC$_2$H$_5$, —OCOCH$_3$, —OCN, —SCN, —NH$_2$, —NHCOCH$_3$; m is 0, 1, 2, 3, 4, 5, 6, 7, or 8, and z is 0, 1, 2, 3 or 4; b) drying, and (c) annealing with formation of a solid layer comprising graphene-like carbon-based structures and possessing anisotropy of conductivity. The annealing step is characterized by level of vacuum, composition of gas flow, annealing temperature, and exposure time which are selected so as to form predominantly planar graphene-like carbon-based structures.

The general description of the present invention having been made, a further understanding can be obtained by reference to the specific preferred embodiments, which are given herein only for the purpose of illustration and are not intended to limit the scope of the appended claims provided below.

Embodiments of the invention are described, by way of example only, with reference to the following Figures, of which:

FIGS. 1*a* and 1*b* schematically show graphene-like carbon-based structures.

FIGS. 2*a* and 2*b* schematically show an embodiment of the disclosed anisotropic semiconductor film, wherein the planes of graphene-like carbon-based structures are oriented predominantly perpendicularly to the substrate surface.

FIGS. 3*a* and 3*b* schematically show an embodiment of the disclosed anisotropic semiconductor film, wherein the planes of graphene-like carbon-based structures are oriented predominantly parallel to the substrate surface.

FIG. 4 shows chemical formulas of six isomers of Bis (carboxybenzimidazoles) of Perylenetetracarboxylic acids.

FIG. 5 schematically shows the disclosed anisotropic semiconductor film after the drying step, wherein the planes of π-conjugated organic compound are oriented predominantly perpendicularly to the substrate surface.

Figure 8:
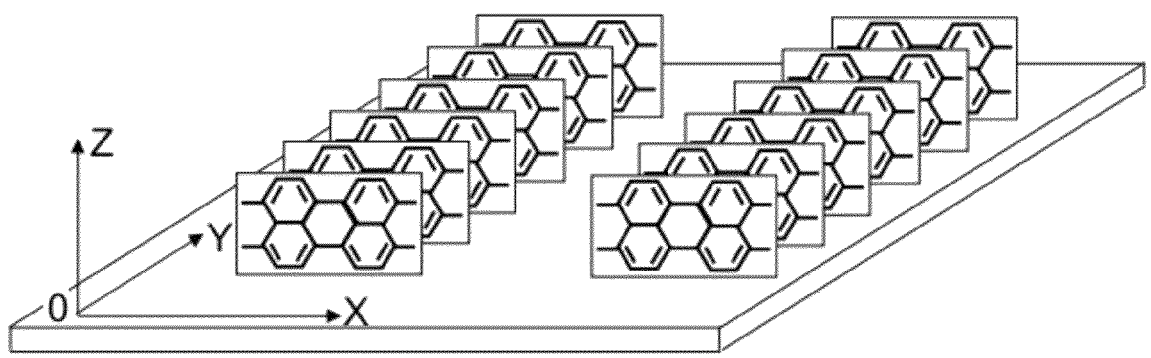

FIG. 8 schematically shows the disclosed anisotropic semiconductor film after the pyrolysis of the organic compound, wherein the planes of carbon-conjugated residues are oriented predominantly perpendicularly to the substrate surface.

Figure 9:
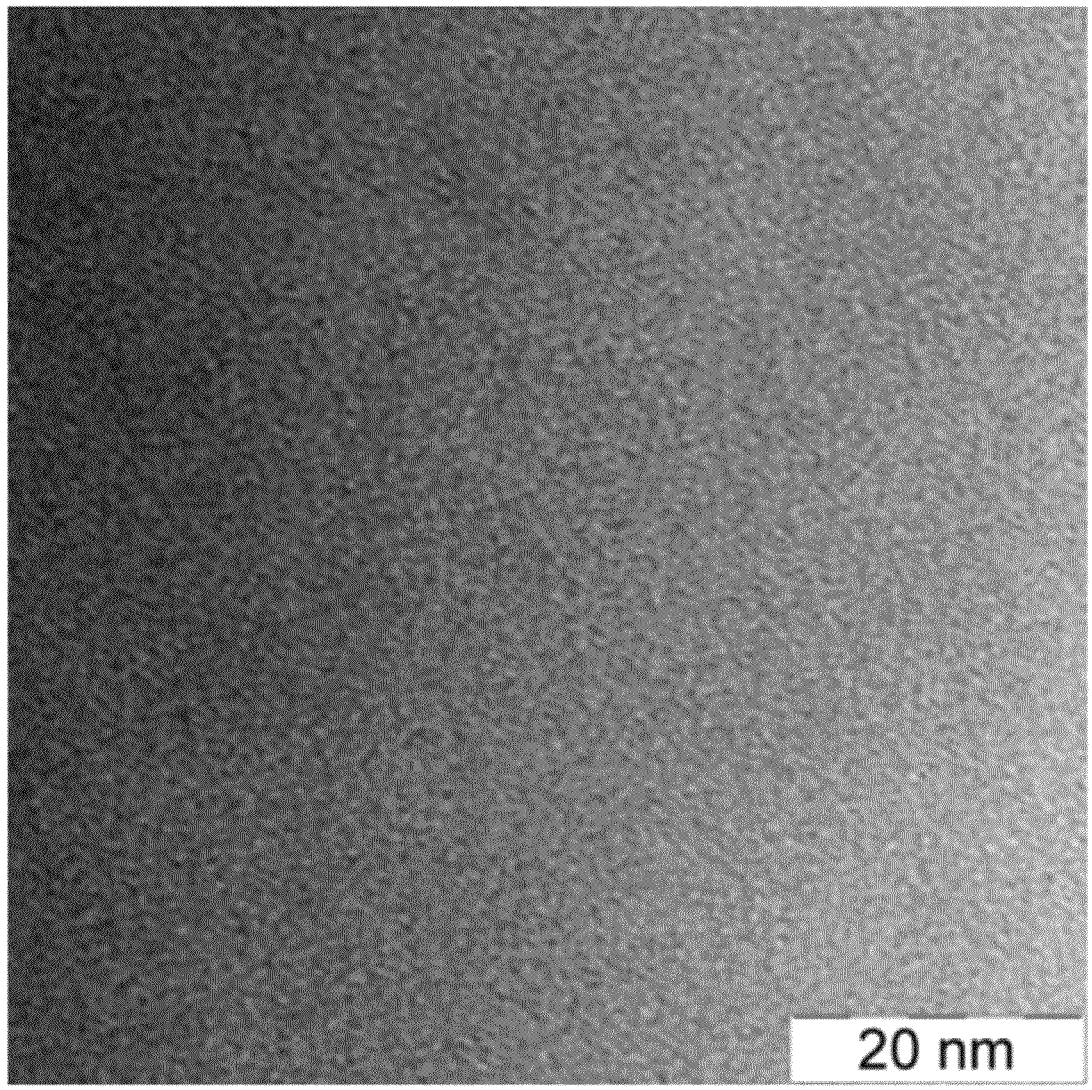

FIG. 9 shows TEM image of bis-carboxy DBIPTCA annealed at 650° C. for 30 minutes.

Figure 10:
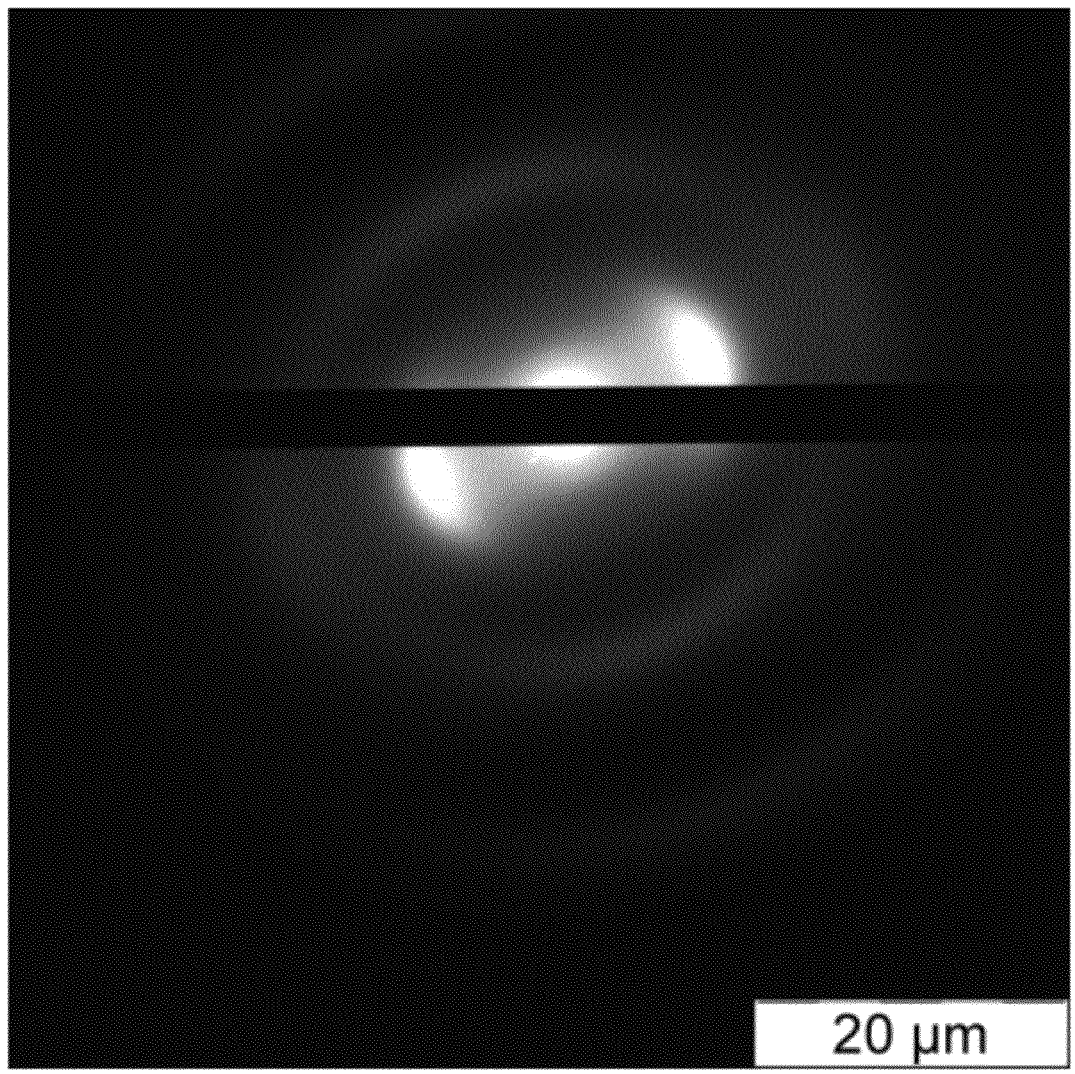

FIG. 10 shows electron diffraction on bis-carboxy DBI-PTCA film annealed at 650° C. for 30 minutes.

Figure 11:
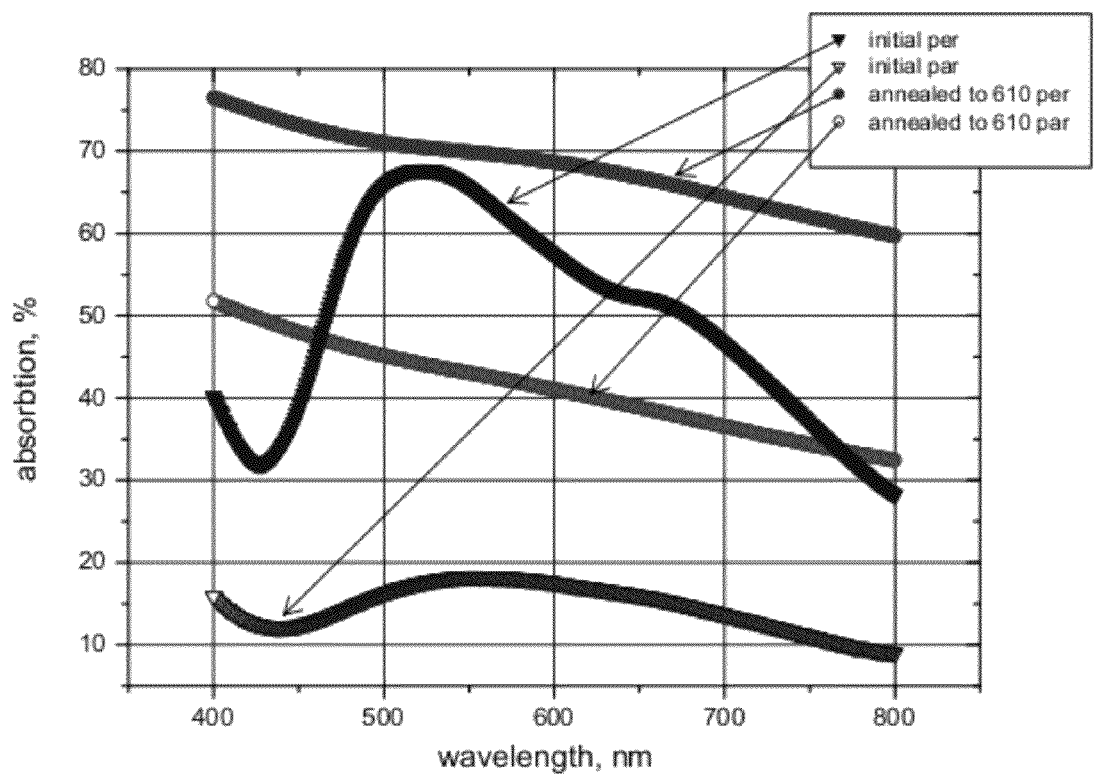

FIG. 11 shows the absorption spectra of bis-carboxy DBI PTCA before and after annealing.

Figure 12:
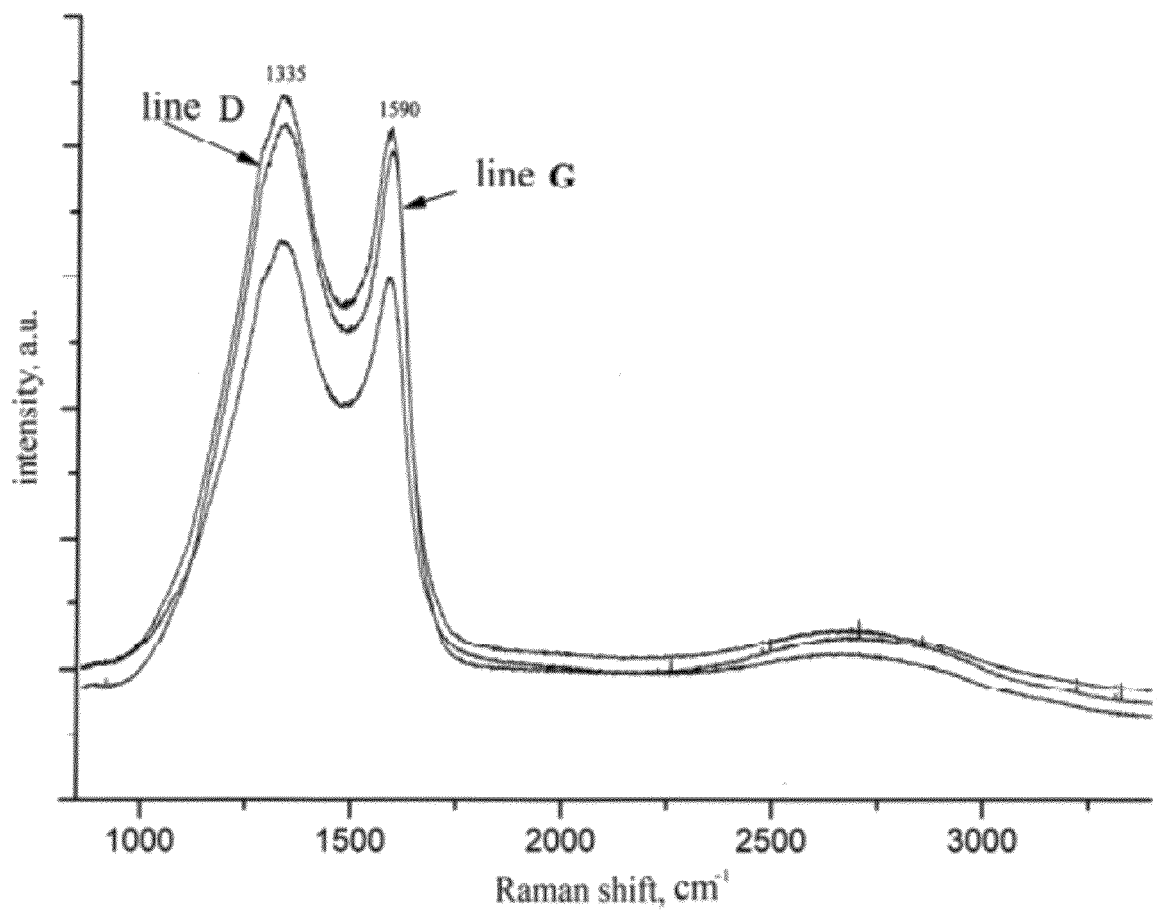

FIG. 12 shows Raman spectra of the annealed samples.

Figure 13:
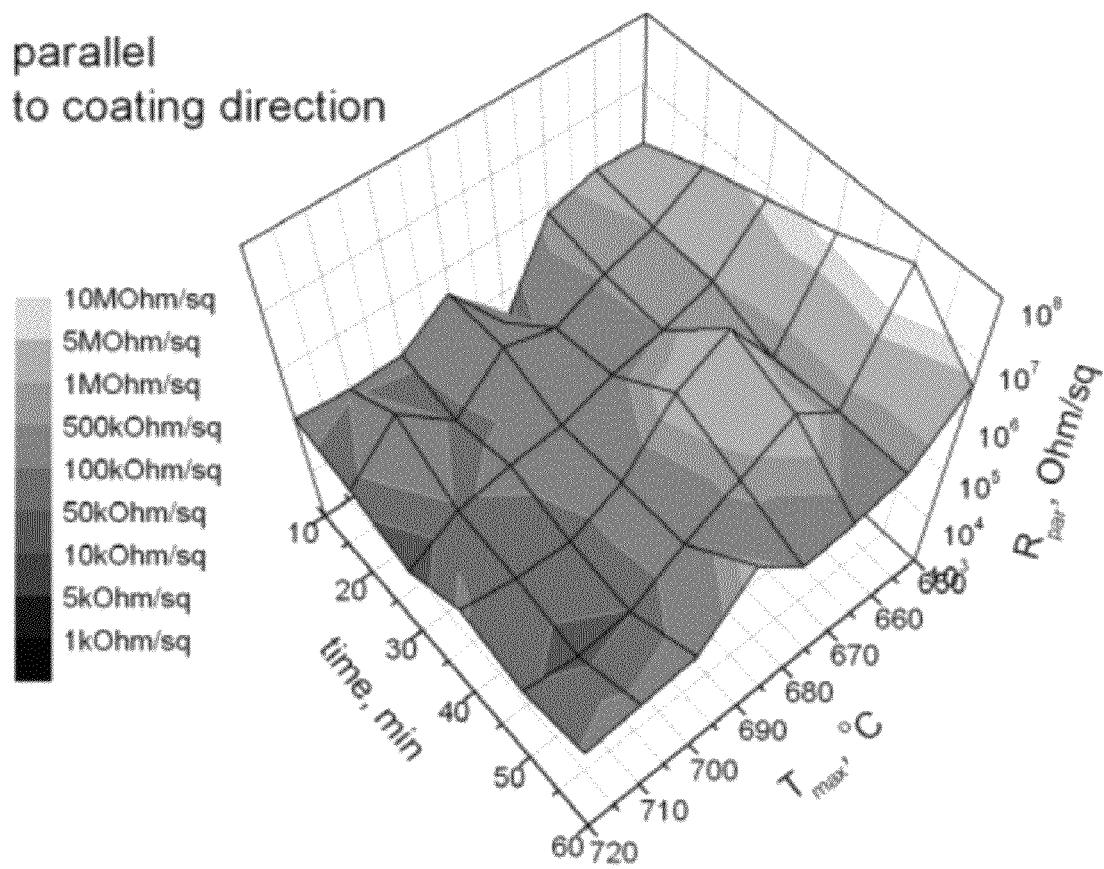

FIG. 13 shows the resistivity measured parallel to coating direction as a function of maximum annealing temperature ($T_{max}$) and time of a sample exposure at maximum temperature.

Figure 14:
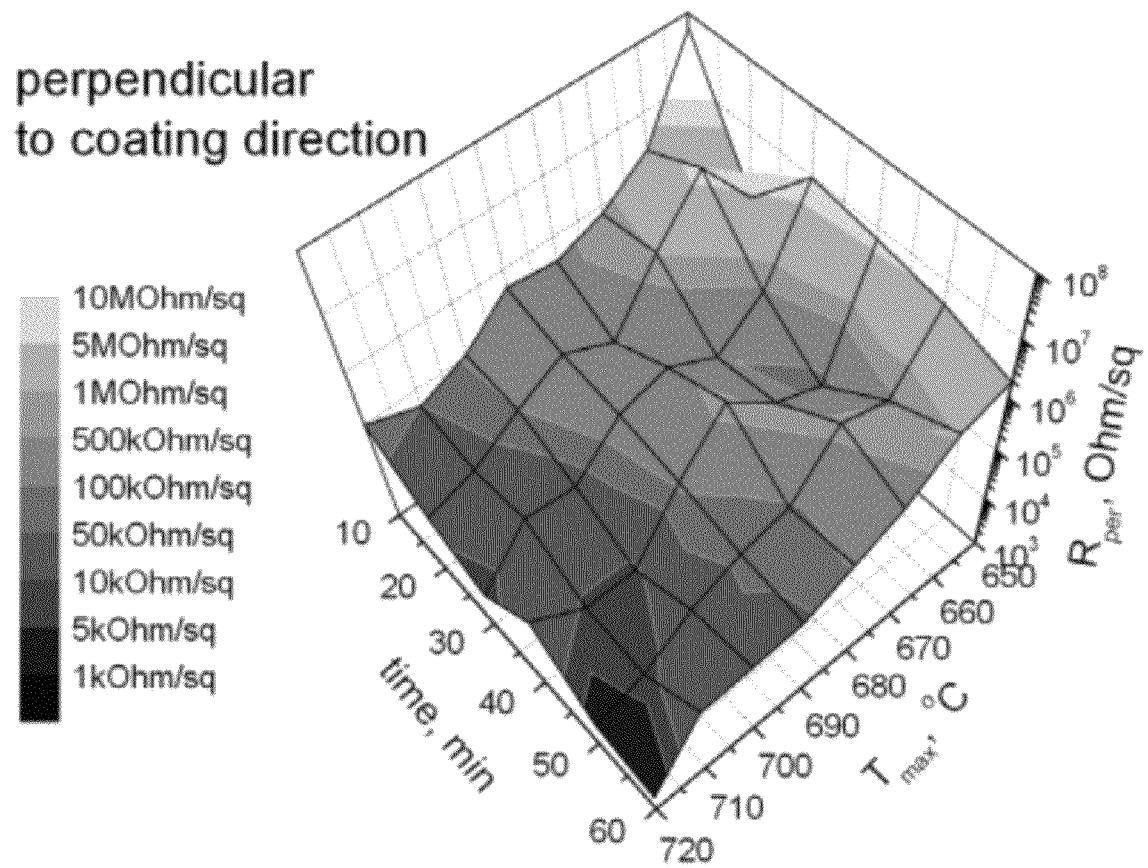

FIG. 14 shows the resistivity measured perpendicular to coating direction as a function of maximum annealing temperature ($T_{max}$) and time of a sample exposure at maximum temperature.

Figure 15:
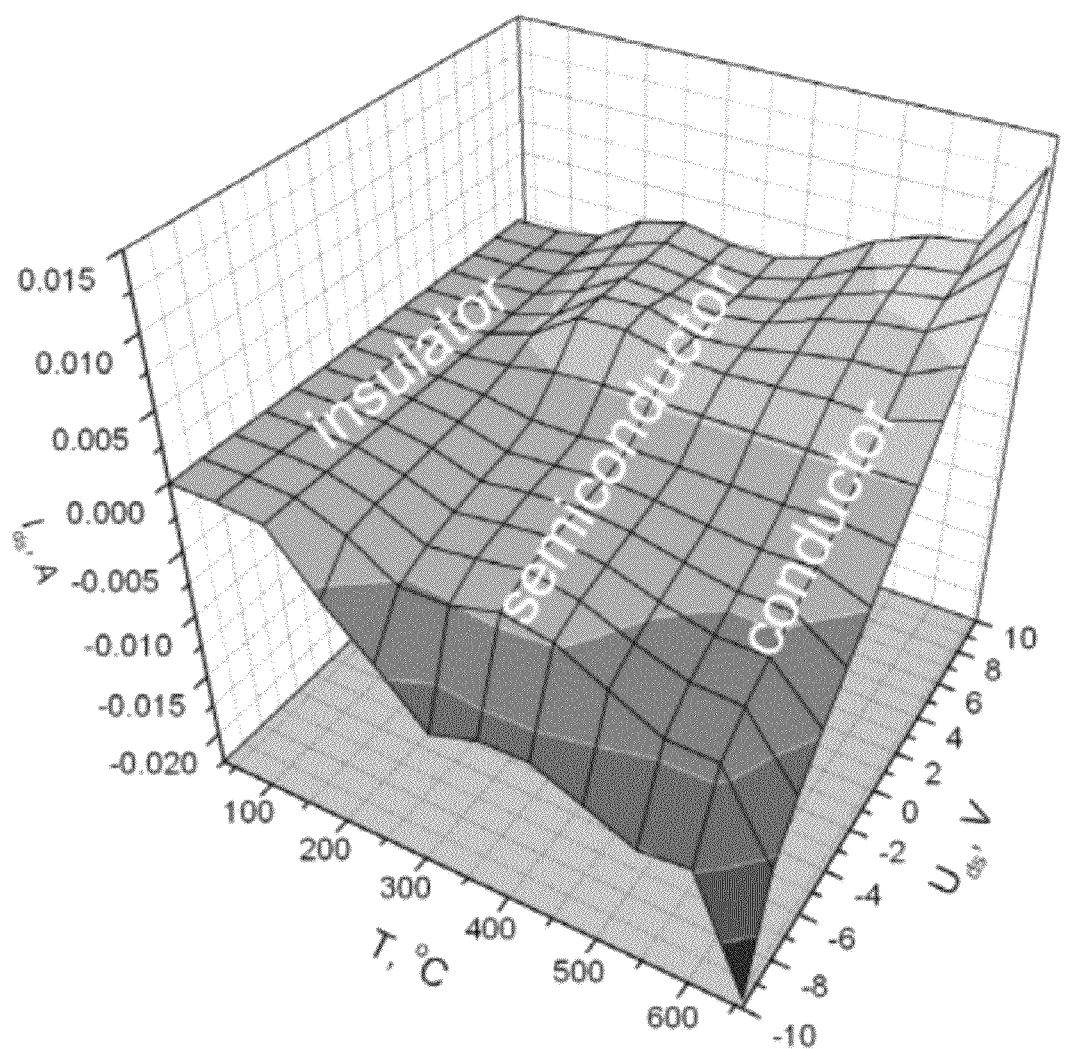

FIG. 15 shows the voltage-current characteristics obtained at different annealing temperatures on bis-carboxy DBI-PTCA layer.

Figure 16:
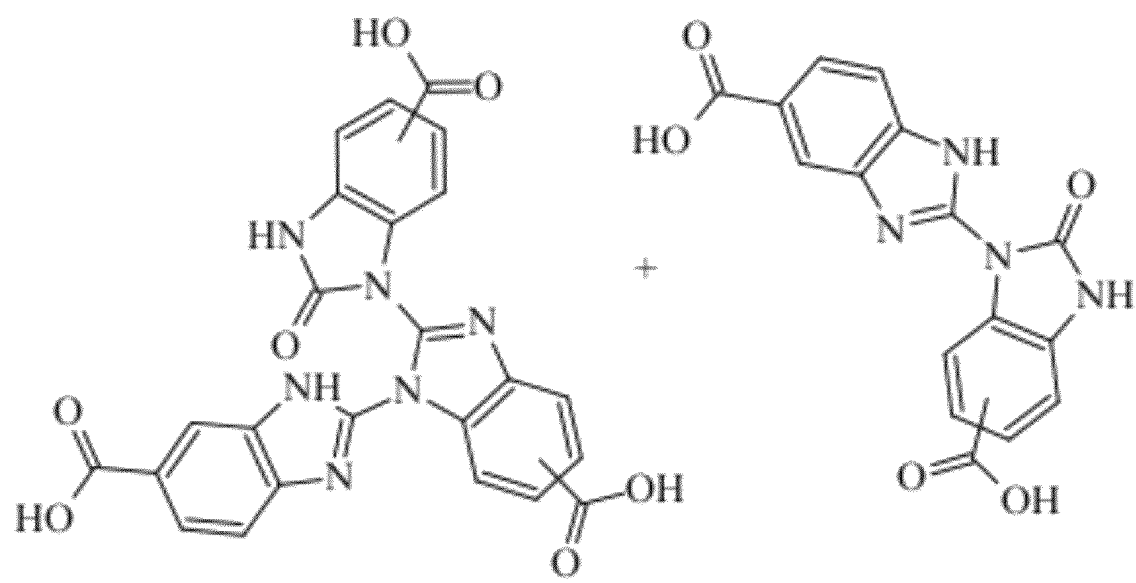

FIG. 16 shows chemical formulas of mixture of 2-oxo-2,3-dihydro-1"H-1,2':1',2"-terbenzimidazoletricarboxylic acids and 2-oxo-2,3-dihydro-1'H-1,2'-bibenzimidazoledicarboxylic acids.

The present invention provides an anisotropic semiconductor film on a substrate as disclosed hereinabove.

Figure 1A:
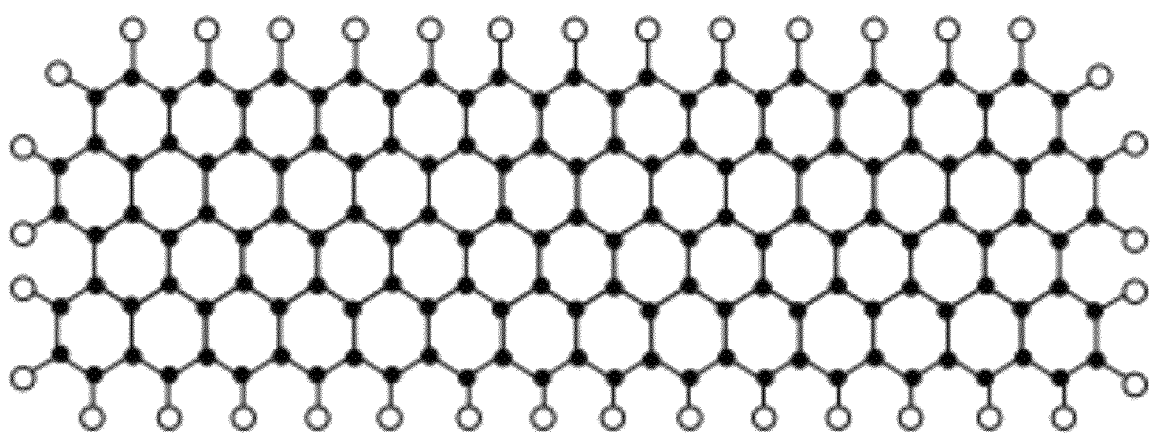
Figure 1B:
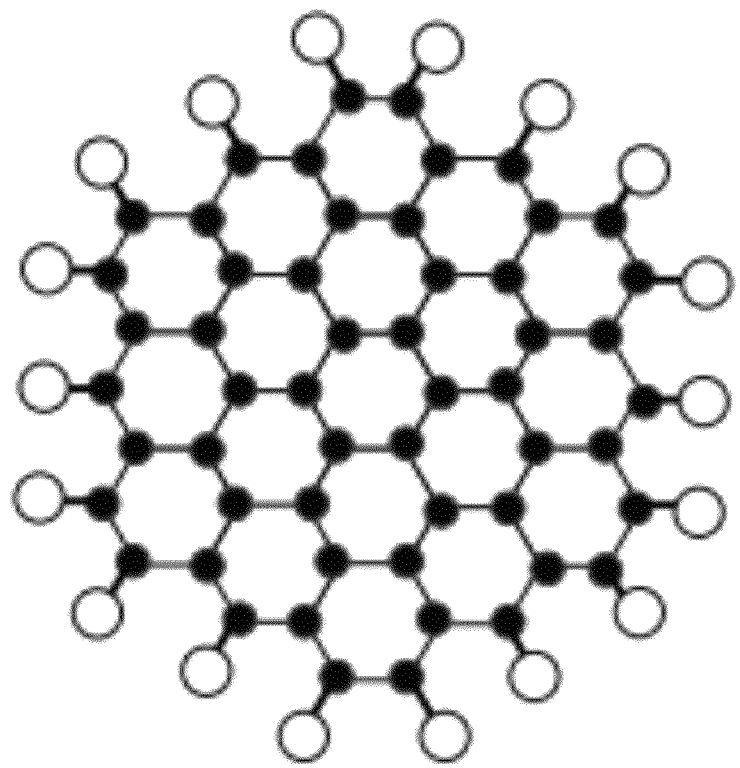

Two embodiments of the graphene-like carbon-based structures are schematically shown in FIG. 1a and FIG. 1b. The graphene-like structure comprises substantially planar hexagonal carbon core (in FIGS. 1a, b the carbon atoms are marked as black circles). The hexagonal carbon core possesses high electric conductivity which approximates to the metal-type conductivity. The atoms of chemical elements (marked in FIGS. 1a, b as white circles), which were used when producing the anisotropic semiconductor film, are located along the perimeter of the graphene-like carbon-based structure.

In one embodiment of the disclosed anisotropic semiconductor film, the solid layer possesses an optical anisotropy. In another embodiment of the anisotropic semiconductor film, the graphene-like carbon-based structures are globally ordered on the substrate surface. The disclosed anisotropic semiconductor film has a global order or, in other words, such film has globally ordered graphene-like carbon-based structures. Disclosed film possesses the long-range order which is characterized by spatial correlation of graphene-like carbon-based structures within the limits of an entire film. Spacing between the structures is approximately equal to 3.5±0.1 Å in the direction approximately parallel to one of crystallographic axis over the entire substrate surface. Such spatial periodicity means that the film possesses the long-range coordination order. The disclosed film may possess the long-range orientation order when hexagonal cells of graphene-like carbon-based structures are orientated substantially uniformly. The global order means that the manufacturing process controls the direction of the crystallographic axes of the anisotropic semiconductor film over the entire substrate surface. Thus, the anisotropic semiconductor film differs from a polycrystalline film, in which the uniform crystalline structure is formed within a separate crystal grain. The square of such grain is much smaller than that of the substrate surface. The substrate surface has a limited influence on the crystal structure of the anisotropic semiconductor film, and consequently on the properties of anisotropic semiconductor film. The anisotropic semiconductor film may be formed on a part of the substrate surface, depending on the system design requirements.

In still another embodiment of the disclosed anisotropic semiconductor film, said organic material is a semiconductor material of n-type. In yet another embodiment of the disclosed anisotropic semiconductor film, said organic material is a semiconductor material of p-type.

Figure 2A:
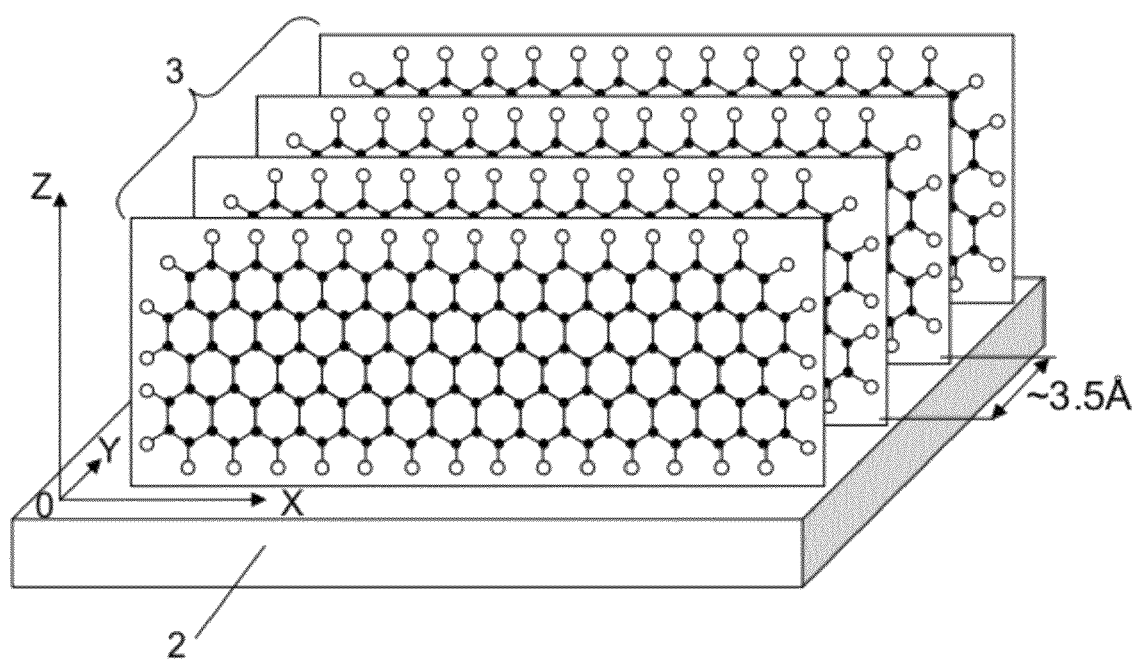
Figure 2B:
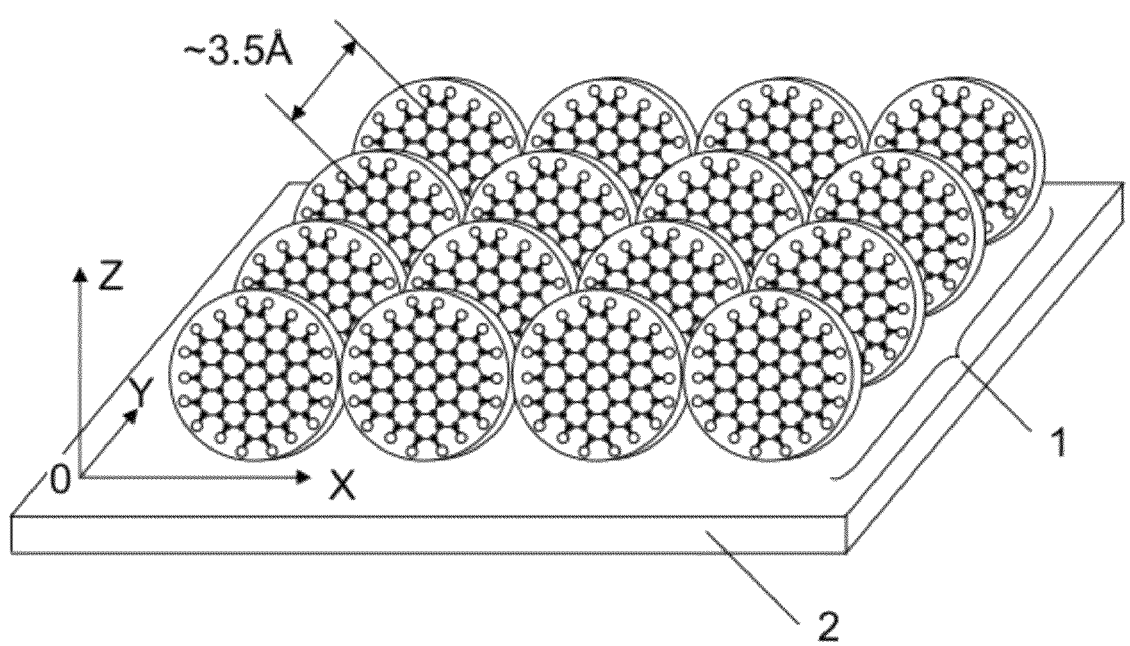
Figure 3A:
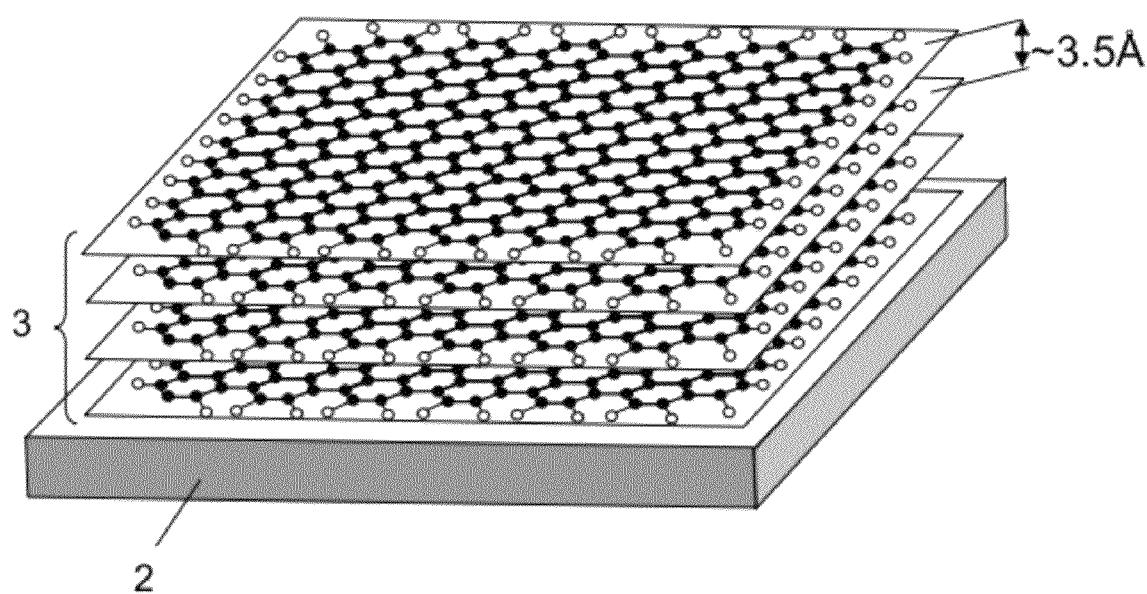
Figure 3B:
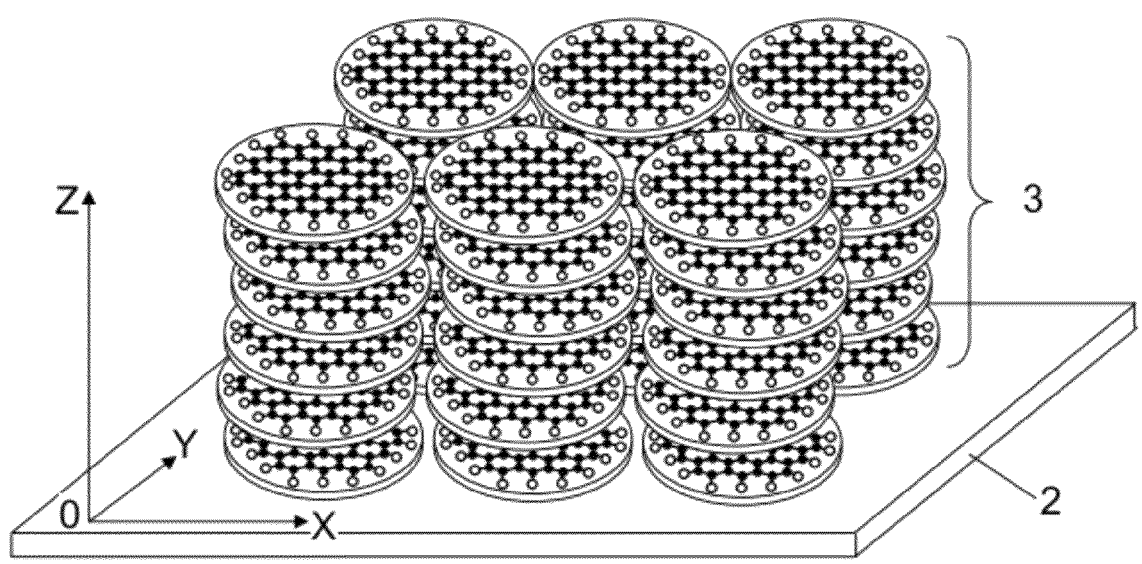

In one embodiment of the disclosed anisotropic semiconductor film, the planes of graphene-like carbon-based structures are oriented predominantly perpendicularly to the substrate surface as shown in FIG. 2a and FIG. 2b. In one embodiment of the disclosed anisotropic semiconductor film, the graphene-like carbon-based structures form stacks (1) oriented in plane of the substrate (2). The stacks shown in FIGS. 2a, b are oriented along the y-axis. In yet another embodiment of the disclosed anisotropic semiconductor film, the planes of graphene-like carbon-based structures are oriented predominantly parallel to the substrate surface as shown in FIG. 3a and FIG. 3b.

In still another embodiment of the disclosed anisotropic semiconductor film, the graphene-like carbon-based structures form stacks (3) oriented predominantly perpendicularly to the substrate surface (2). The stacks shown in FIGS. 3 a, b are oriented along the z-axis.

In yet another embodiment of the disclosed invention, the anisotropic semiconductor film further comprises areas which possess hopping conductivity. Contact of two and more graphene-like carbon-based structures may lead to formation of the local states located between said structures. These local states contribute to transport processes of charge carriers in a semiconductor film. This contribution is named as hopping conductivity as it results from hops of carriers from one local center onto another.

In one embodiment of the disclosed anisotropic semiconductor film, the substrate is made of a flexible material. In another embodiment of the disclosed anisotropic semiconductor film, the substrate is made of a rigid material. The surface of the substrate may be flat, convex, concave, or have a geometric shape combining these forms. The substrate may be made of one or several materials of the group comprising Si, Ge, SiGe, GaAs, diamond, quartz, silicon carbide, indium arsenide, indium phosphide, silicon germanium carbide, gallium arsenic phosphide, gallium indium phosphide, plastics, glasses, ceramics, metal-ceramic composites, and metals. In still another embodiment of the disclosed anisotropic semiconductor film, a distance between planes of the graphene-like carbon-based structures approximately equals to 3.5±0.1 Å. In yet another embodiment of the disclosed anisotropic semiconductor film, the graphene-like carbon-based structures have the form selected from the list comprising disk, plate, lamella, ribbon or any combination thereof.

The present invention also provides the method of producing the anisotropic semiconductor film, as disclosed hereinabove.

In one embodiment of the disclosed method the annealing is characterized by time dependence of annealing temperature which is selected so as to ensure 1) partial pyrolysis of the organic compound with at least partial removing of substituents, hetero-atomic and solubility groups from the solid layer, and 2) fusion of the carbon-conjugated residues in order to form the predominantly planar graphene-like carbon-based structures.

In one embodiment of the disclosed method, the drying and annealing steps are carried out simultaneously. In another embodiment of the disclosed method, the drying and annealing steps are carried out sequentially. In yet another embodiment of the disclosed method, the gas flow comprises chemical elements selected from the list comprising hydrogen, fluorine, arsenic, boron and any combination thereof.

In one embodiment of the disclosed invention, the method further comprises a post-treatment in a gas atmosphere, wherein the post-treatment step is carried out after the annealing. In another embodiment of the disclosed method, the gas atmosphere for the post-treatment step comprises chemical elements selected from the list comprising hydrogen, fluorine, arsenic, boron and any combination thereof.

In still another embodiment of the disclosed invention, the method further comprises a doping step carried out after the post-treatment step. During the doping step the solid layer is doped with impurities. In yet another embodiment of the disclosed method, the doping step is based on a diffusion method or an ion implantation method. In one embodiment of the disclosed method, the impurity is selected from the list comprising the following elements: Sb, P, As, Ti, Pt, Au, O, B, Al, Ga, In, Pd, S and any combination thereof.

In another embodiment of the disclosed method, at least one of the hetero-atomic groups is selected from the list comprising imidazole group, benzimidazole group, amide group and substituted amide group.

In still another embodiment of the disclosed method, said solution is based on water. In yet another embodiment of the disclosed method, at least one of the substituents providing a solubility of the organic compound in water is selected from the list comprising $COO^-$, $SO_3^-$, $HPO_3^-$, and $PO_3^{2-}$ and any combination thereof. In one embodiment of the disclosed method, the solid layer has planar graphene-like carbon-based structures with planes oriented predominantly perpendicularly to the substrate plane.

In another embodiment of the disclosed method, said solution is based on organic solvent. In still another embodiment of the disclosed method, the organic solvent is selected from the list comprising ketones, carboxylic acids, hydrocarbons, cyclohydrocarbons, chlorohydrocarbons, alcohols, ethers, esters, acetone, xylene, toluene, ethanol, methylcyclohexane, ethyl acetate, diethyl ether, octane, chloroform, methylenechloride, dichloroethane, trichloroethene, tetrachloroethene, nitromethane, acetonitrile, dimethylformamide, dimethylsulfoxide, 1,4-dioxane, tetrahydrofuran (THF), pyridine, triethylamine and any combination thereof. In one embodiment of the disclosed method, the hydrocarbons are selected from the list comprising benzene, toluene, and xylenes. In yet another embodiment of the disclosed method, at least one of the substituents providing a solubility of the organic compound is an amide of an acid residue independently selected from the list comprising $CONR_1R_2$, $CONH$-$CONH_2$, $SO_2NR_1R_2$, and any combination thereof, where $R_1$ and $R_2$ are independently selected from H, alkyl or aryl. —$(CH_2)_nCH_3$ may be used as alkyl, where n is generally an integer from 0 to 27 and n is an integer from 1 to 10 in the preferred embodiment. Benzyl or phenyl may be used as aryl in preferred embodiments of the present invention. In one embodiment of the disclosed method, at least one of the substituents providing a solubility of the organic compound is alkyl. In another embodiment of the disclosed method, the solid layer has planar graphene-like carbon-based structures with planes oriented predominantly parallel to the substrate plane.

In still another embodiment of the disclosed method, said organic compound comprises rylene fragments. Table 1 shows some examples of heterocyclic molecular systems comprising rylene fragments of a general structural formula corresponding to structures 1-24.

TABLE 1

Examples of organic compound with rylene fragments

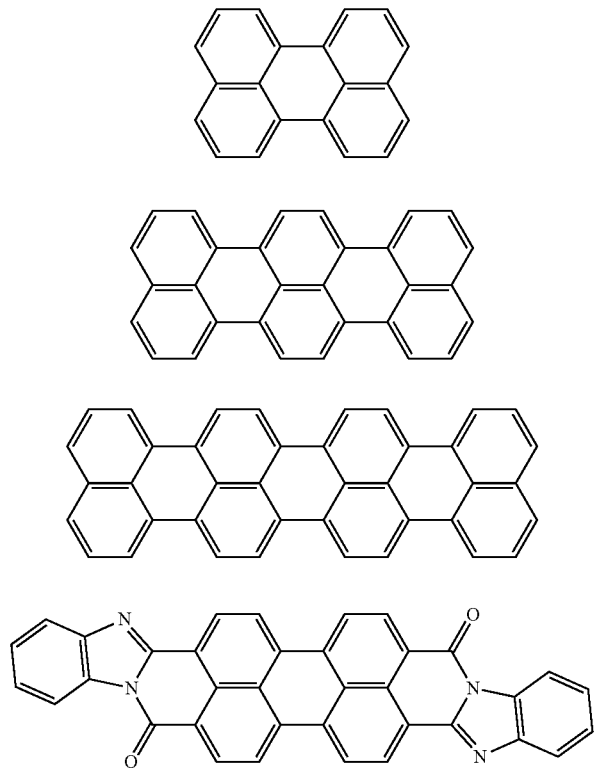

TABLE 1-continued

Examples of organic compound with rylene fragments

| | |
|---|---|
| *structure* | 5 |
| *structure* | 6 |
| *structure* | 7 |
| *structure* | 8 |
| *structure* | 9 |
| *structure* | 10 |
| *structure* | 11 |
| *structure* | 12 |

TABLE 1-continued
Examples of organic compound with rylene fragments
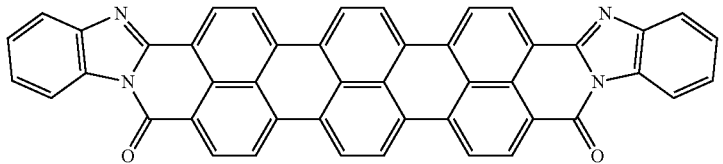
13
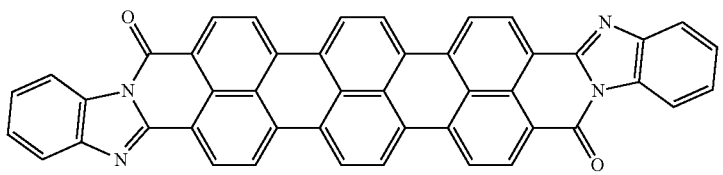
14
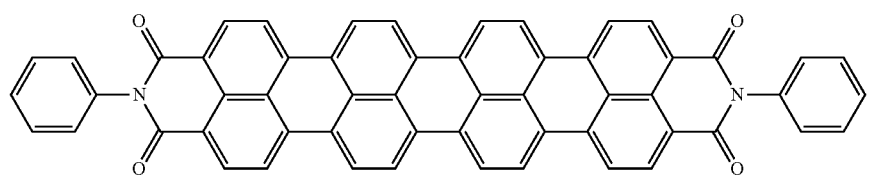
15
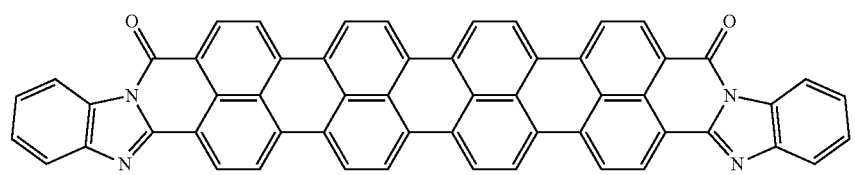
16
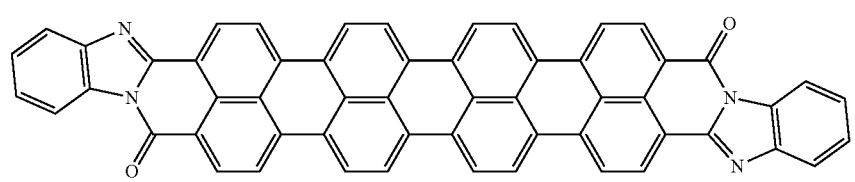
17
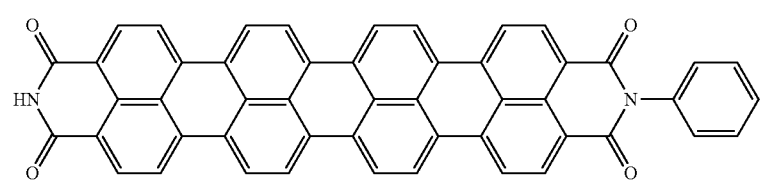
18
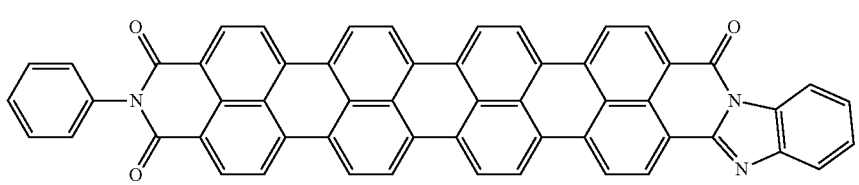
19
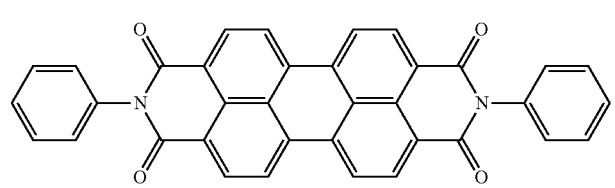
20

TABLE 1-continued

Examples of organic compound with rylene fragments

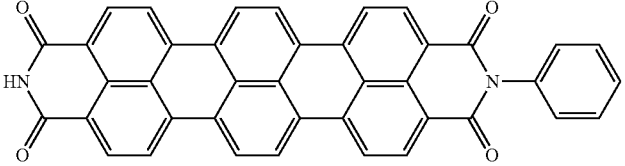

21

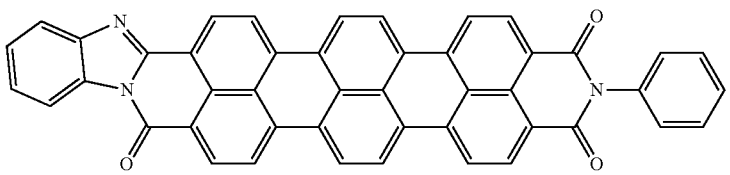

22

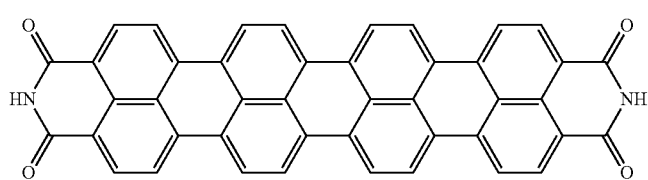

23

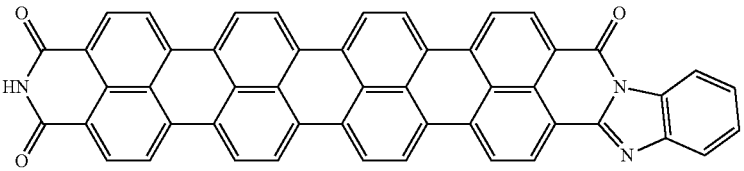

24

In another embodiment of the disclosed method, the organic compound comprises anthrone fragments. Table 2 shows some examples of organic compounds comprising such anthrone fragments of a general structural formula corresponding to structures 25-35.

TABLE 2

Examples of planar heterocyclic molecular systems comprising anthrone fragments

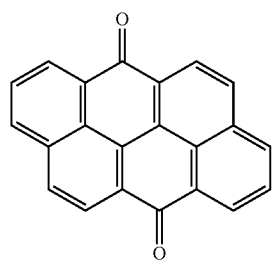

25

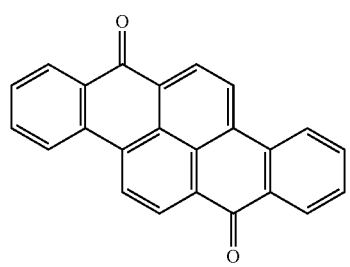

26

TABLE 2-continued

Examples of planar heterocyclic molecular systems comprising anthrone fragments

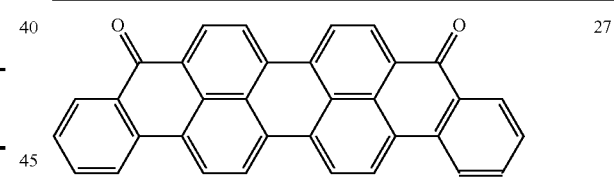

27

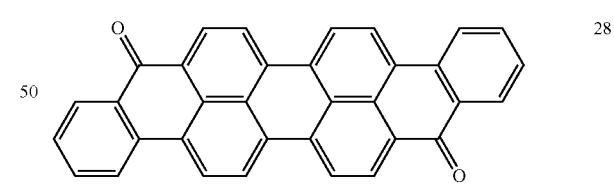

28

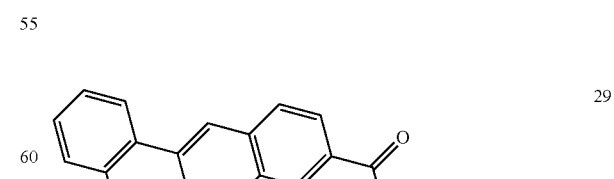

29

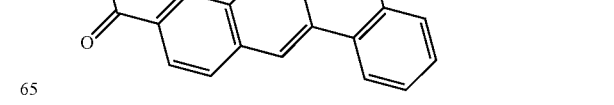

TABLE 2-continued

Examples of planar heterocyclic molecular systems comprising anthrone fragments

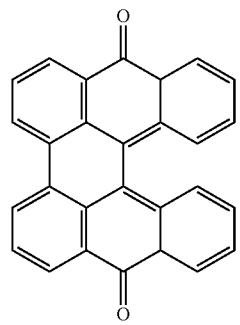

30

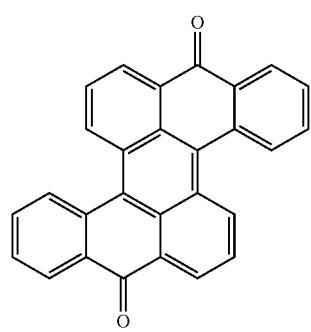

31

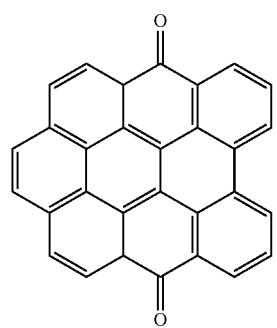

32

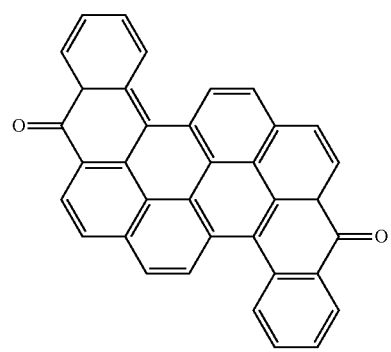

33

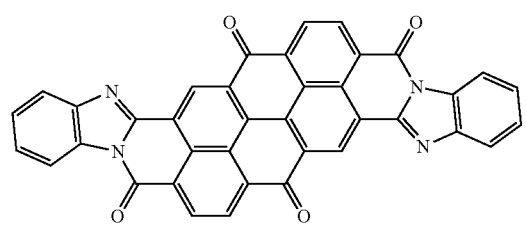

34

TABLE 2-continued

Examples of planar heterocyclic molecular systems comprising anthrone fragments

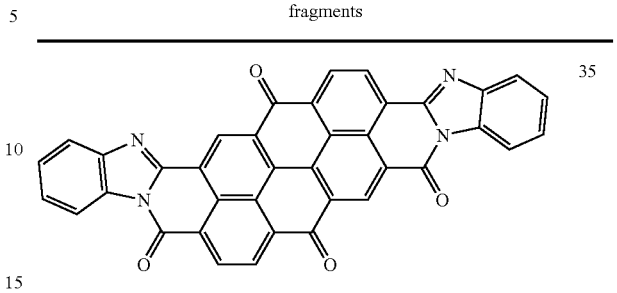

35

In another embodiment of the disclosed method, the organic compound comprises planar fused polycyclic hydrocarbons. Table 3 shows some examples of organic compounds comprising such planar fused polycyclic hydrocarbons selected from the list comprising truxene, decacyclene, antanthrene, hexabenzotriphenylene, 1.2,3.4,5.6,7,8-tetra-(peri-naphthylene)-anthracene, dibenzoctacene, tetrabenzoheptacene, peropyrene, and hexabenzocoronene, and has a general structural formula from the group comprising structures 36-45.

TABLE 3

Examples of planar heterocyclic molecular systems comprising planar fused polycyclic hydrocarbons

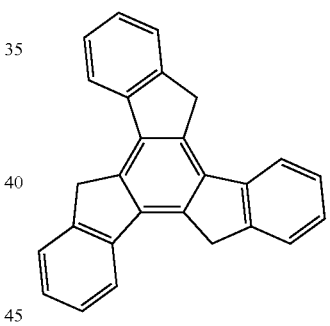

36

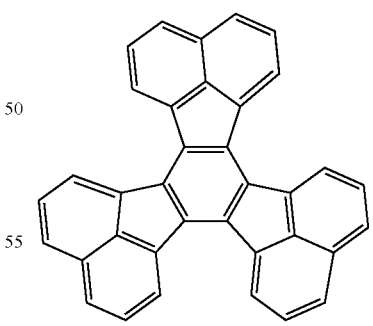

37

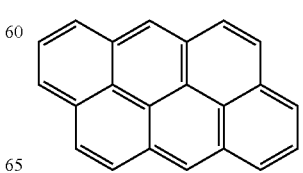

38

TABLE 3-continued

Examples of planar heterocyclic molecular systems comprising planar fused polycyclic hydrocarbons

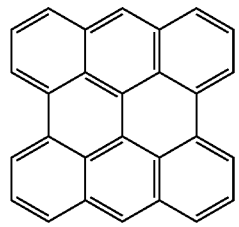
39

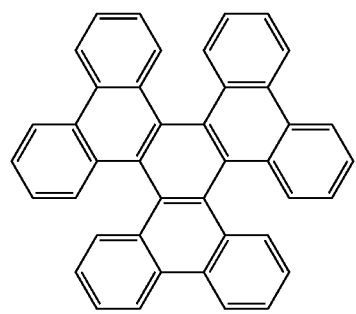
40

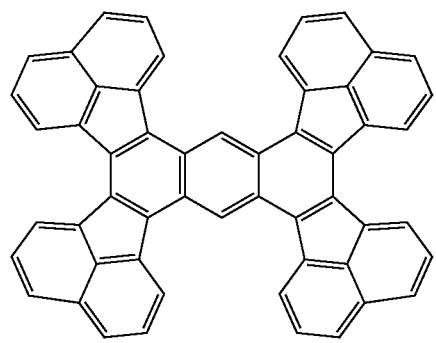
41

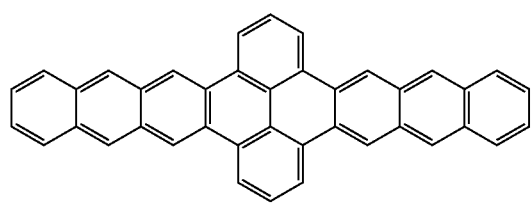
42

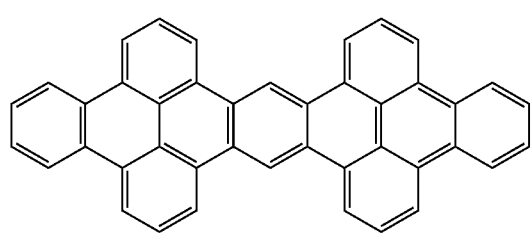
43

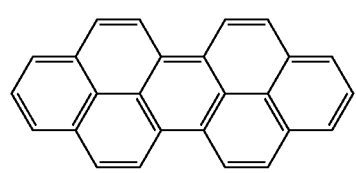
44

TABLE 3-continued

Examples of planar heterocyclic molecular systems comprising planar fused polycyclic hydrocarbons

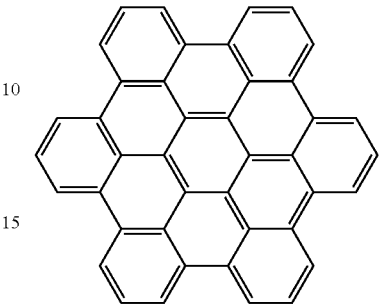
45

In another embodiment of the disclosed method, the organic compound comprises coronene fragments. Table 4 shows some examples of organic compounds comprising such coronene fragments of a general structural formula corresponding to structures 46-53.

TABLE 4

Examples of organic compounds comprising coronene fragments

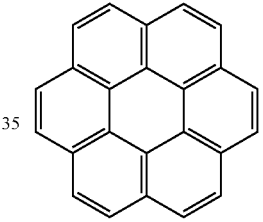
46

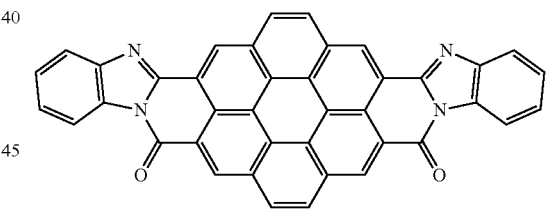
47

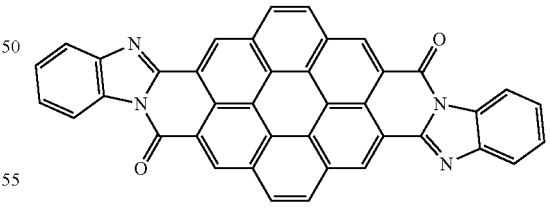
48

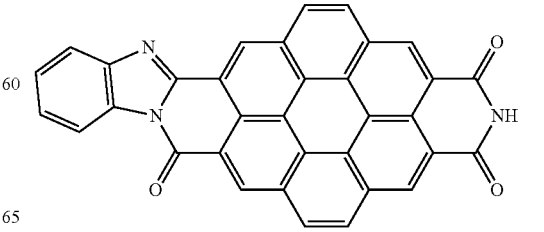
49

TABLE 4-continued

Examples of organic compounds comprising coronene fragments

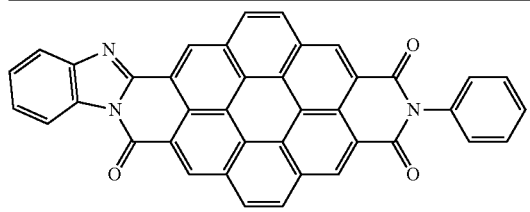
50

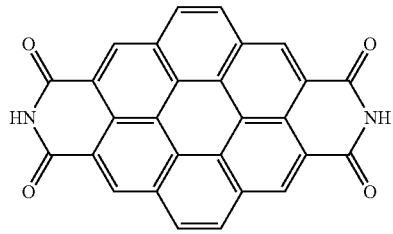
51

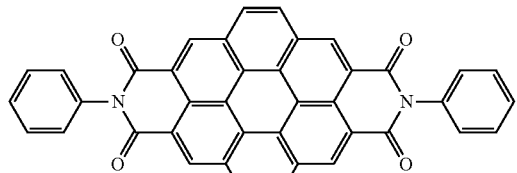
52

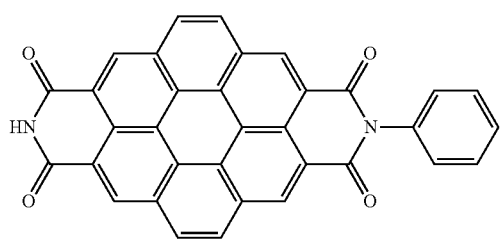
53

In another embodiment of the disclosed method, the organic compound comprises naphthalene fragments. Table 5 shows some examples of organic compounds comprising such naphthalene fragments of a general structural formula corresponding to structures 54-55.

TABLE 5

Examples of organic compounds comprising naphthalene fragments

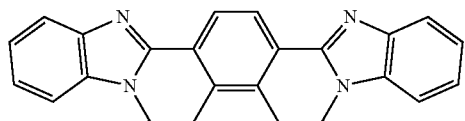
54

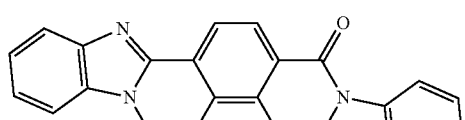
55

In still another embodiment of the disclosed method, the organic compound comprises pyrazine or/and imidazole fragments. Table 6 shows some examples of organic compounds comprising such pyrazine or/and imidazole fragments of a general structural formula corresponding to structures 56-61.

TABLE 6

Examples of organic compounds comprising pyrazine or/and imidazole fragments

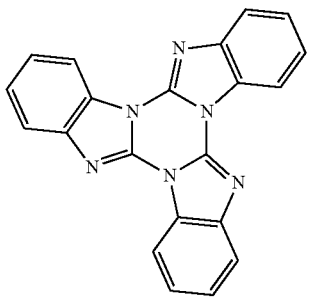
56

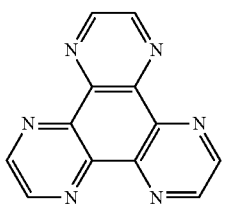
57

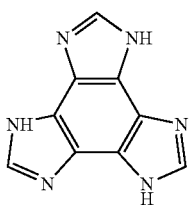
58

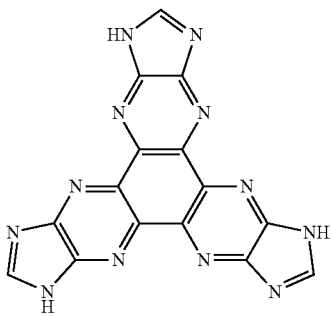
59

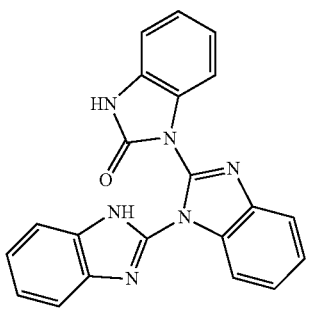
60

TABLE 6-continued

Examples of organic compounds comprising pyrazine or/and imidazole fragments

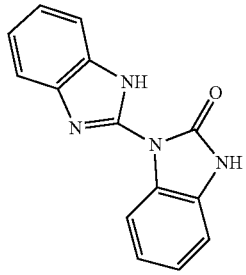
61

The drying step may be carried out at room temperature and humidity of around 70%. The drying temperature may be in a range from 24° C. (room temperature) up to approximately 250° C. In one embodiment of the disclosed method, the drying step is carried out using airflow. In another embodiment of the disclosed method and prior to the application of the solution on the substrate, the substrate is pretreated so as to render its surface hydrophilic. In still another embodiment of the disclosed method, said solution is isotropic. In yet another embodiment of the disclosed method, said solution is a lyotropic liquid crystal solution. In one embodiment of the disclosed invention, the method further comprises an alignment action, wherein the alignment action is simultaneous or subsequent to the application of said solution on the substrate.

The solution layer may be coated on the substrate by various methods such as spray-coating, printing, slot-die or Mayer rod technique or other method known in the art. In one embodiment of the disclosed method, said application step is carried out using a spray-coating. In still another embodiment of the disclosed method, said application step is carried out using printing.

In one embodiment of the disclosed method, the D-substituents further comprise molecular binding groups which number and arrangement provide for the formation of planar supramolecules from the organic compound molecules in the solution via non-covalent chemical bonds. In another embodiment of the disclosed method, at least one binding group is selected from the list comprising a hydrogen acceptor ($A_H$), a hydrogen donor ($D_H$), and a group having the general structural formula

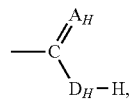

wherein the hydrogen acceptor ($A_H$) and hydrogen donor ($D_H$) are independently selected from the list comprising NH-group, and oxygen (O). In still another embodiment of the disclosed method, at least one of the binding groups is selected from the list comprising hetero-atoms, COOH, $SO_3H$, $H_2PO_3$, NH, $NH_2$, CO, OH, NHR, NR, COOMe, $CONH_2$, $CONHNH_2$, $SO_2NH_2$, $—SO_2—NH—SO_2—NH_2$ and any combination thereof, where radical R is an alkyl group or an aryl group, the alkyl group having the general formula $C_nH_{2n+1}$ — where n is 1, 2, 3 or 4, and the aryl group being selected from the group consisting of phenyl, benzyl and naphthyl. In yet another embodiment of the disclosed method, the non-covalent chemical bonds are independently selected from the list comprising a single hydrogen bond, dipole-dipole interaction, cation-pi-interaction, Van-der-Waals interaction, coordination bond, ionic bond, ion-dipole interaction, multiple hydrogen bond, interaction via the hetero-atoms and any combination thereof. In one embodiment of the disclosed method, the planar supramolecules have the form selected from the list comprising disk, plate, lamella, ribbon or any combination thereof. In another embodiment of the disclosed method, the planar supramolecules are predominantly oriented in the plane of the substrate.

In yet another embodiment of the disclosed method, the steps of the method of producing an anisotropic semiconductor film, or in other words the cycle of the technological operations comprising the steps of the solution application, drying and annealing, is repeated two or more times, and sequential solid layers are formed using solutions based on similar or different combinations of the organic compounds.

The annealing step may be carried out in vacuum. The pyrolysis may be carried out in the range of temperatures between approximately 150° C. and 450° C. The fusion may be carried out in the range of temperatures between approximately 500° C. and 800° C. The temperature and duration of pyrolysis and temperature and duration of fusion are determined experimentally for each organic compound or any combination of said organic compounds.

In order that the invention may be more readily understood, reference is made to the following examples, which are intended to be illustrative of the invention, but are not intended to be limiting in scope.

EXAMPLE 1

Figure 4:
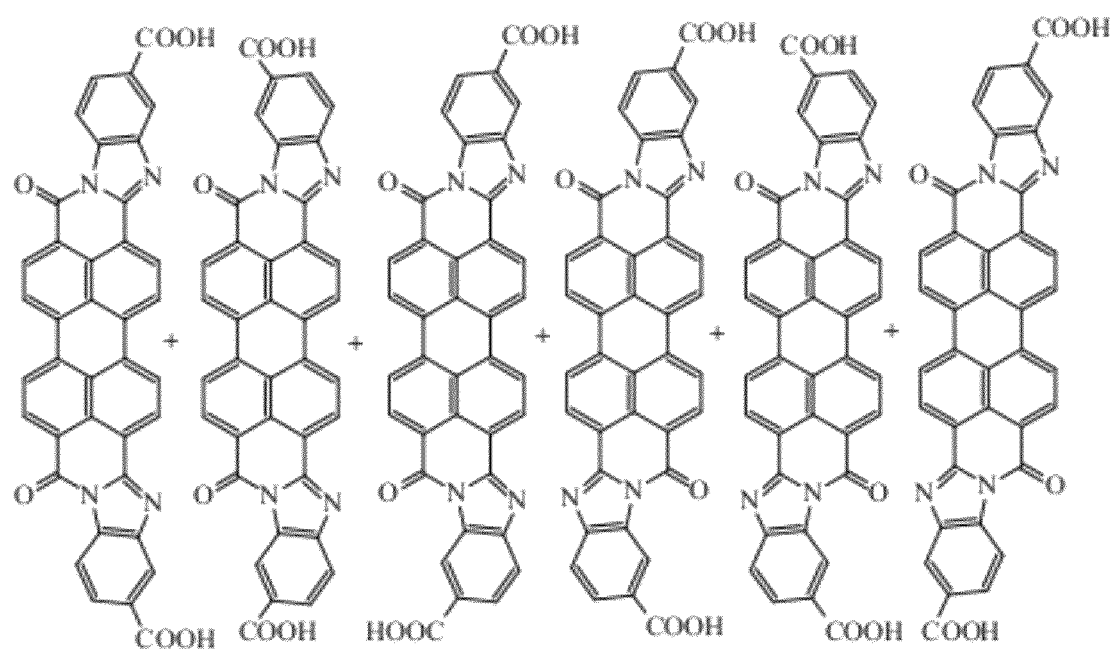
Figure 5:
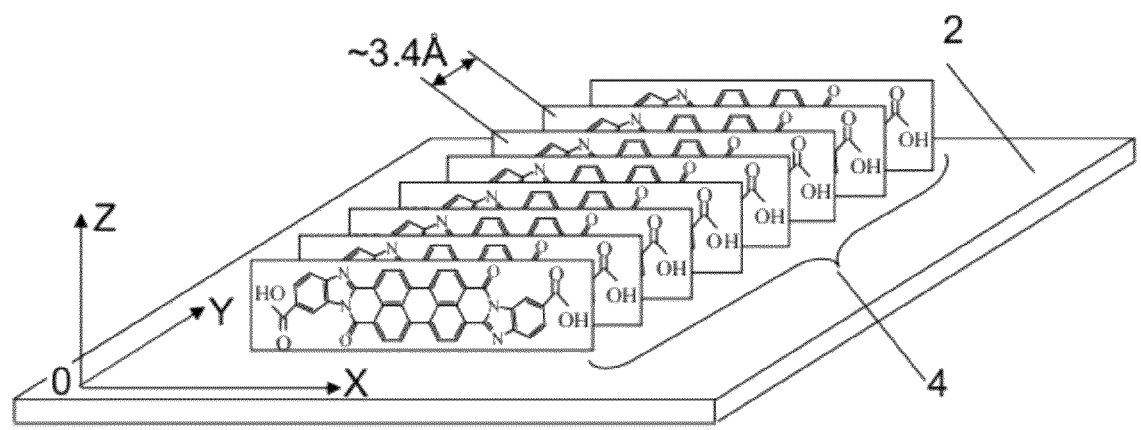

This example describes another embodiment of an anisotropic semiconductor film of the present invention. The graphene-like carbon-based layer was formed of mixture of bis(carboxybenzimidazoles) of prerylenetetracarboxylic acids (bis-carboxy DBI PTCA). As a first step, water solution of bis-carboxy DBI PTCA ammonium salts is applied on a substrate. The solution comprises a mixture of six isomers as shown in FIG. 4. Bis-carboxy DBI PTCA is a π-conjugated organic compound, where the predominantly planar carbon-conjugated core (CC as in formula I) comprises rylene fragments, the benzimidazole groups serve as hetero-atomic groups and carboxylic groups serve as substituents providing solubility. In addition to that, the carboxylic groups provide for the formation of rod-like molecular stacks. Quartz is used as a substrate material. The invention is not limited to quartz as the substrate material. The Mayer rod technique is used to coat the water-based solution of bis-carboxy DBI PTCA. During the second step the drying is performed at room temperature and humidity of approximately 70%. By the end of the drying step, the layer usually retains about 10% of the solvent. As a result of drying the layer comprises supramolecules oriented along the coating direction. FIG. 5 schematically shows the supramolecule (1) oriented along the y-axis and located on the substrate (2). The distance between planes of bis-carboxy DBI PTCA is approximately equal to 3.4 A.

Figure 6:
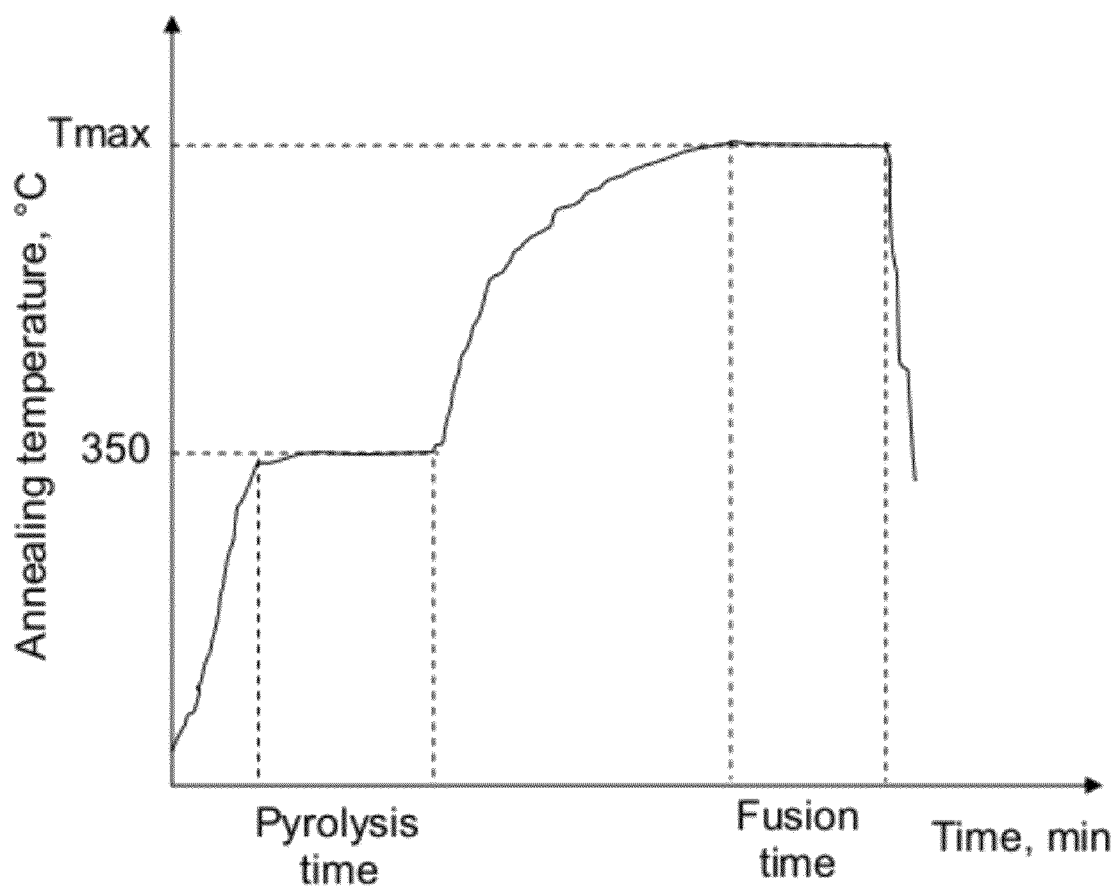
FIG. 6 shows the typical annealing regime.

The annealing step is carried out in vacuum. It includes two stages—exposure of bis-carboxy DBI PTCA film at 350° C. during 30 minutes, and annealing in the temperature range of 650-700° C. for approximately 10 to 60 minutes. The annealing regime is shown in FIG. 6. The annealing regimes are selected so as to ensure partial pyrolysis of the organic compound with formation of carbon-conjugated residues. At least part of the substituents D and S and hetero-atomic groups have been removed from the solid layer. Thickness of the bis-carboxy DBIPTCA film after the drying stage was about 50 nm. After the annealing the decrease in layer thickness was about 60%. This value is essentially reproducible in the above referenced time and temperature ranges.

Figure 7:
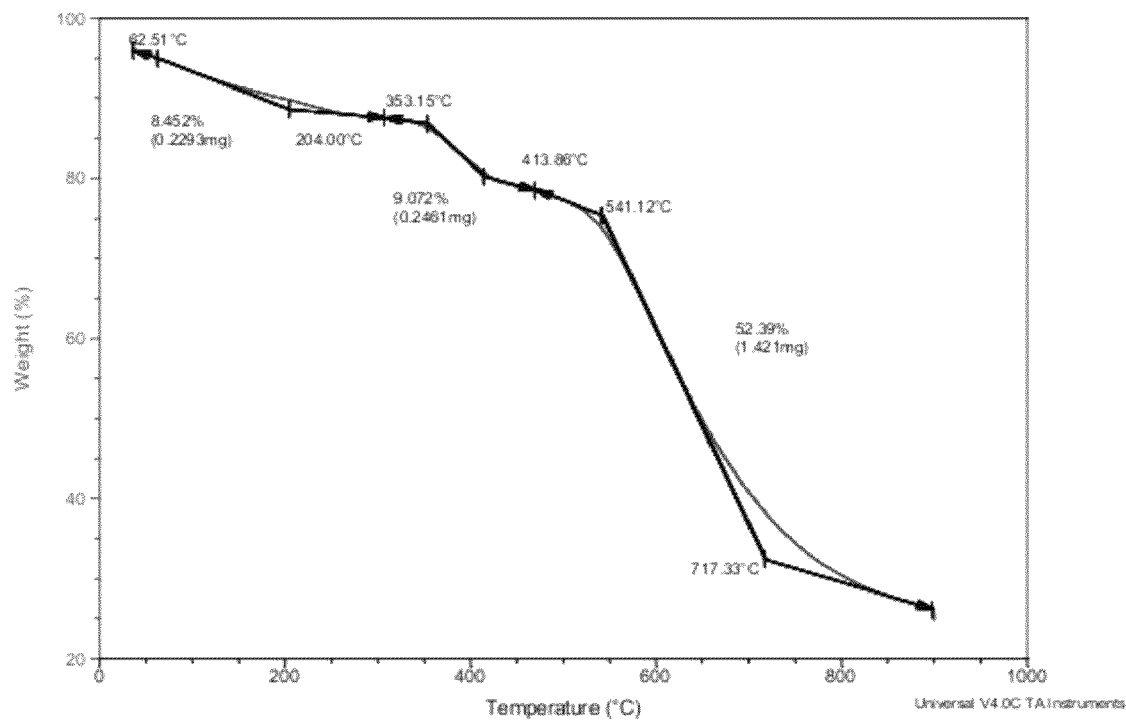
FIG. 7 shows the results of thermo-gravimetric analysis of the bis-carboxy DBI PTCA layer.

A thermo gravimetric analysis of the layer of bis-carboxy DBI PTCA is shown in FIG. 7. The layer of bis-carboxy DBI PTCA has three main stages: 1) water and ammonia removal from the film (24-250° C.), 2) decarboxylation process (353-415° C.), and 3) DBI PTCA layer partial pyrolysis with carbon-conjugated residues forming (541-717° C.). Formula weight (FW) of Bis(carboxybenzimidazoles) of PTCA is shown in Table 7.

strate is shown in FIG. 9. There is global preferential orientation in the layer order. The presence of the orientation is proved also by electron diffraction images (FIG. 10). There are two clear maximum that corresponds to the 1D ordering in the layer. The position of the maximums relates to the distance about 3.4-3.5 Å. This value is in a good arrangement with intermolecular distance between graphene-like carbon-based structures. Absorption spectra of the annealed and dried

TABLE 7

Formula weight (FW) of Bis(carboxybenzimidazoles) of PTCA

| # | Structure | FW | Loss, % |
|---|---|---|---|
| 1 | [structure: bis-carboxy DBI PTCA with two COOH groups] | 624.557 | 0 |
| 2 | [structure: mono-carboxy DBI PTCA with one COOH group] | 580.5475 | 7.05 |
| 3 | [structure: DBI PTCA without COOH groups] | 536.538 | 14.09 |
| 4 | [structure: mono-benzimidazole PTCA fragment] | 394.4236 | 36.85 |
| 5 | [structure: perylene] | 252.3093 | 59.60 |

The resulted carbon-conjugated residues form the intermediate anisotropic structure represented in FIG. 8.

Further annealing results in formation of predominantly planar graphene-like carbon-based structures via thermal polymerization of the carbon-conjugated residues. One possible embodiment of such graphene-like carbon-based structures is schematically shown in FIG. 1a. The graphene-like structure comprises a substantially planar hexagonal carbon core (the carbon atoms are marked as black circles in FIG. 1a). The hexagonal carbon core possesses high electrical conductivity which is close to the metal conductivity. Atoms of hydrogen (white circles in FIG. 1a) are positioned along the perimeter of graphene-like carbon-based structure. FIG. 2a schematically shows the anisotropic graphene-like carbon-based layer (3) on the substrate (2) after the annealing step. The graphene-like carbon-based layer formed on a sublayer of bis-carboxy DBI PTCA are shown in FIG. 11. The absorption spectrum of the annealed sample shows an optical anisotropy.

FIG. 12 shows Raman spectra of the annealed samples. The spectra were taken at different points of the sample surface. There are typical lines for the $sp^2$ carbon material. The position of these lines (D and G) and their high FWHM suggests that the film consists of nanodimensional carbon crystallites.

Measurements of resistivity of the films have been made using standard methods. Resistivities were measured parallel (FIG. 13) and perpendicular (FIG. 14) to coating direction. Resistivity highly depends on time and temperature of the annealing step. FIGS. 13 and 14 show the resistivity as a function of maximum annealing temperature ($T_{max}$) and time of the sample exposure at maximum temperature. In our example resistivity decreases with increasing of time and temperature of annealing. In the most cases resistivity perpendicular to coating direction is about two times smaller than resistivity parallel to coating direction. Thus, the graphene-like layer possesses anisotropy of resistivity. Such anisotropy of the resistivity corresponds to a better charge transport in the direction along the graphene-like carbon-based structures. The voltage-current characteristics obtained at different annealing temperatures on bis-carboxy DBI-PTCA layer is shown in FIG. 15. The graphene-like layers are characterized by dependence of conductivity (a reciprocal value of electrical resistivity) on an annealing temperature and by transition: dielectric-semiconductor-conductor state. High value of the conductivity provides another evidence of the global order of a graphene-like layer.

EXAMPLE 2

This example describes an anisotropic semiconductor film based on bis(carboxybenzimidazoles) of prerylenetetracarboxylic acids (bis-carboxy DBI PTCA), and measurement of mobility of free charges in the annealed bis-carboxy DBI PTCA layer. The coating was applied with a Mayer rod on n-doped silicon wafer initially covered with a thin layer of silicon dioxide of silicon using a Mayer rod. The annealing was performed at 650° C. in vacuum for approximately 40 minutes. Thickness of the bis-carboxy DBI PTCA layer was 58 nm. Current-voltage characteristic was measured with the methods known in the art. Said measurements were completed along the coating (application) direction. All contacts to the film which were necessary for the measurements were deposited by thermal evaporation technique. The measured current-voltage characteristics were used for calculation of mobility. Calculated mobility was equal to 0.073 cm$^2$/v·sec.

EXAMPLE 3

This example describes another embodiment of an anisotropic semiconductor film of the present invention. The graphene-like carbon-based layer was formed on a substrate using mixture of 2-oxo-2,3-dihydro-1"H-1,2':1',2"-terbenzimidazoletricarboxylic acids and 2-oxo-2,3-dihydro-1'H-1,2'-bibenzimidazoledicarboxylic acids shown in FIG. 16. A 15 g-mixture of 2-oxo-2,3-dihydro-1"H-1,2':1',2"-terbenzimidazoletricarboxylic acids and 2-oxo-2,3-dihydro-1'H-1,2'-bibenzimidazoledicarboxylic acids was dissolved in 85 g of dimethylformamide and stirred at 20° C. until total dissolution of the solid phase. Then the solution was filtered. Quartz plates were prepared for coating by treating in a 10% NaOH solution for 30 min, rinsing with deionized water, and drying in airflow with the aid of a compressor. Prior to the coating, samples were rinsed with isopropyl alcohol. The obtained solution was applied onto a quartz plate with a Mayer rod #4 at a temperature approximately 23° C. and relative humidity of about 50%. The layer was dried in a hot air flow. The dried samples were heated to 250° C. for 30 minutes.

The annealing step was carried out in vacuum at 650° C. for approximately 20 minutes. The layer thickness dropped down from approximately 100 nm to 60 nm. The duration and temperature of this step were selected so as to ensure partial pyrolysis of the organic compound with formation of carbon-conjugated residues. The substituents D and S and hetero-atomic groups have been at least partially removed from the solid layer. The further annealing resulted in formation of predominantly planar graphene-like carbon-based structures via thermal polymerization of the carbon-conjugated residues. One possible embodiment of such graphene-like carbon-based structures is schematically shown in FIG. 1a. The graphene-like structure comprises substantially planar hexagonal carbon core (the carbon atoms are marked as black circles in FIG. 1a). The hexagonal carbon core possesses high electric conductivity which verges towards the conductivity of metals. The annealing step was carried out in a hydrogen flow and the atoms of hydrogen (white circles in FIG. 1a) were positioned along the perimeter of graphene-like carbon-based structure. FIG. 3a schematically shows the anisotropic graphene-like carbon-based layer (3) on the substrate (2) after the annealing step, where the carbon-based structures have a homeotropic alignment.

Although the present invention has been described in detail with reference to a particular preferred embodiment, persons possessing ordinary skill in the art to which this invention pertains will appreciate that various modifications and enhancements may be made without departing from the spirit and scope of the claims that follow.

What is claimed is:
1. A method of producing an anisotropic semiconductor film, which comprises the following steps:
   (a) application on a substrate of a solution of one π-conjugated organic compound of the general structural formula I or a combination of such organic compounds:

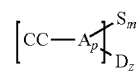

(I)

where CC is a predominantly planar carbon-conjugated core;
A is an hetero-atomic group;
p is 0, 1, 2, 3, 4, 5, 6, 7, or 8;
S and D are substituents
where S is a substituent providing a solubility of the organic compound and
D is a substituent from a list comprising —NO2, —Cl, —Br, —F, —CF3, —CN, —OCH3, —OC2H5, —OCOCH3, —OCN, —SCN, —NH2, and —NHCOCH3;
m is 0, 1, 2, 3, 4, 5, 6, 7, or 8; and
z is 0, 1, 2, 3 or 4,
(b) drying, and
(c) annealing with formation of a solid layer comprising graphene-like carbon-based structures and possessing anisotropy of conductivity,
wherein said annealing is characterized by level of vacuum, composition of gas flow, annealing temperature, and exposure time which are selected so as to form predominantly planar graphene-like carbon-based structures.

2. A method according to claim 1, wherein the annealing is characterized by time dependence of annealing temperature which is selected so as to ensure 1) partial pyrolysis of the organic compound with at least partial removing of substituents, hetero-atomic and solubility groups from the solid layer, and 2) fusion of the carbon-conjugated residues in order to form the predominantly planar graphene-like carbon-based structures.

3. A method according to claim 1, wherein the drying and annealing steps are carried out simultaneously or sequentially.

4. A method according to claim 1, wherein the gas flow comprises chemical elements selected from the list comprising hydrogen, fluorine, arsenic, boron and any combination thereof.

5. A method according to claim 1, further comprising a post-treatment in a gas atmosphere, wherein the post-treatment step is carried out after the annealing, and wherein the gas atmosphere for the post-treatment step comprises chemical elements selected from the list comprising hydrogen, fluorine, arsenic, boron and any combination thereof.

6. A method according to claim 5, further comprising a doping step, which is carried out after the annealing step or after the post-treatment step, wherein the doping step is based on a diffusion method or ion implantation method, and during which the solid layer is doped with impurities, wherein the impurity is selected from the list comprising the following elements: Sb, P, As, Ti, Pt, Au, O, B, Al, Ga, In, Pd, S and any combination thereof.

7. A method according to claim 1, wherein at least one of the hetero-atomic groups is selected from the list comprising imidazole group, benzimidazole group, amide group and substituted amide group.

8. A method according to claim 1, wherein said solution is based on water, and wherein at least one of the substituents providing a solubility of the organic compound is selected from the list comprising $COO^-$, $SO3^-$, $HPO3^-$, and $PO3^{2-}$ and any combination thereof.

9. A method according to claim 8, wherein the solid layer has planar graphene-like carbon-based structures with planes oriented predominantly perpendicularly to the substrate plane.

10. A method according to claim 1, wherein said solution is based on organic solvent, wherein the organic solvent is selected from the list comprising ketones, carboxylic acids, hydrocarbons, cyclohydrocarbons, chlorohydrocarbons, alcohols, ethers, esters, acetone, xylene, toluene, ethanol, methylcyclohexane, ethyl acetate, diethyl ether, octane, chloroform, methylenechloride, dichloroethane, trichloroethene, tetrachloroethene, nitromethane, acetonitrile, dimethylformamide, dimethulsulfoxide, 1,4-dioxane, tetrahydrofuran (THF), pyridine, triethylamine and any combination thereof, the hydrocarbons are selected from the list comprising benzene, toluene, and xylenes, wherein at least one of the substituents providing a solubility of the organic compound is alkyl or an amide of an acid residue independently selected from the list comprising $CONR_1R_2$, $CONHCONH_2$, $SO_2NR_1R_2$, and any combination thereof, where $R_1$ and $R_2$ are independently selected from H, alkyl or aryl, wherein the alkyl is $-(CH_2)nCH_3$, where n is an integer from 0 to 27, and wherein the aryl is benzyl or phenyl.

11. A method according to claim 1, wherein the solid layer has planar graphene-like carbon-based structures with planes oriented predominantly parallel to the substrate plane.

12. A method according to claim 1, wherein said organic compound comprises rylene fragments, having a general structural formula from the group comprising structures 1-24:

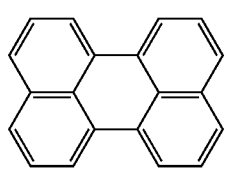

1

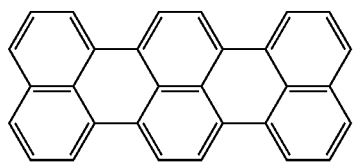

2

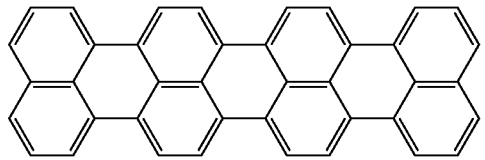

3

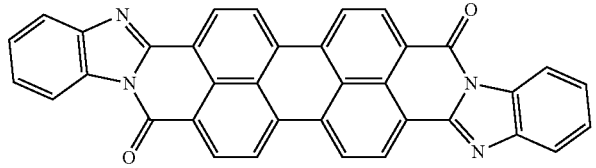

4

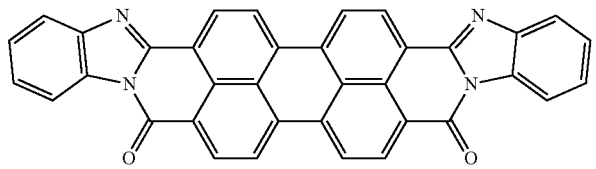

5

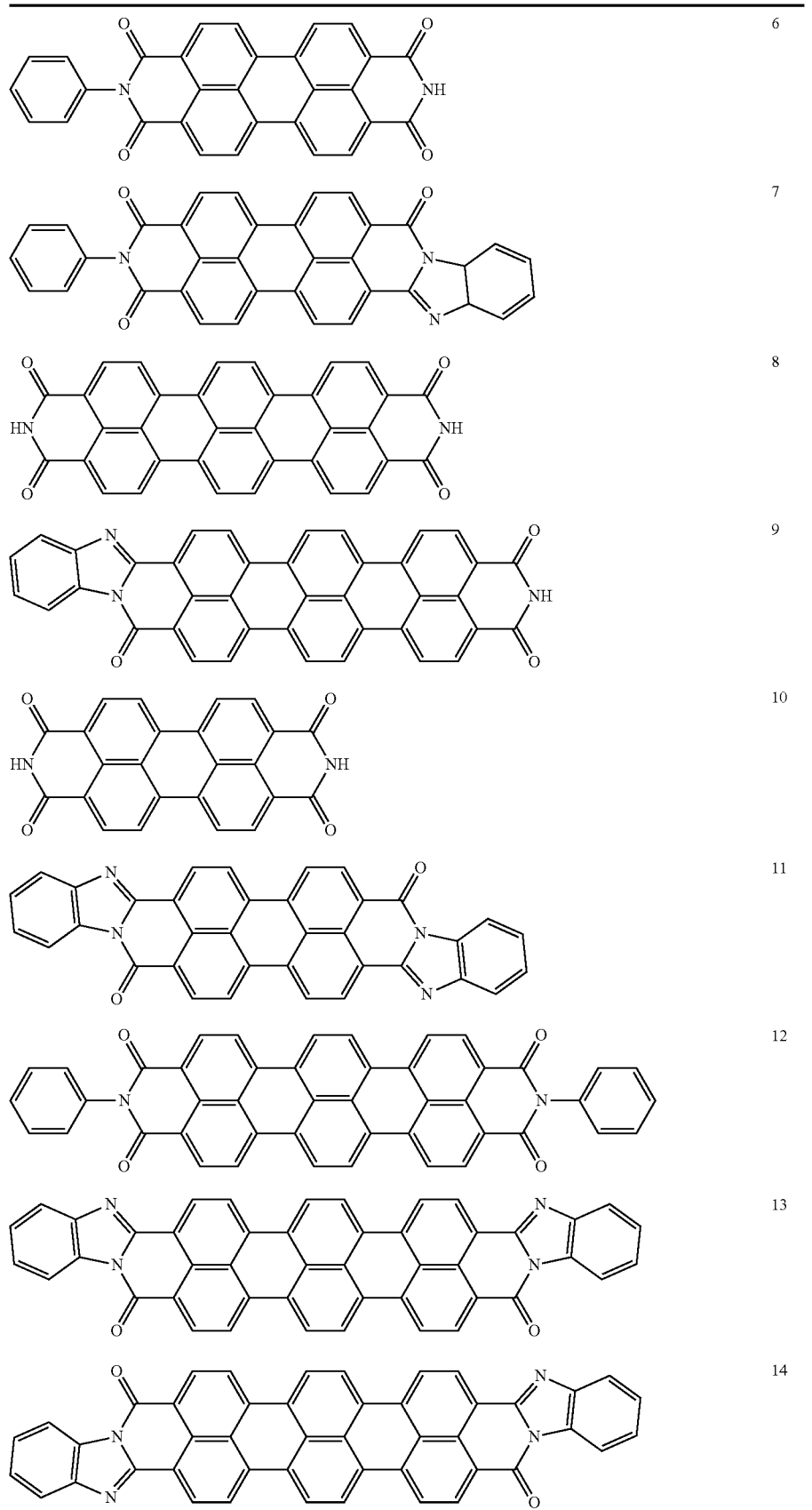

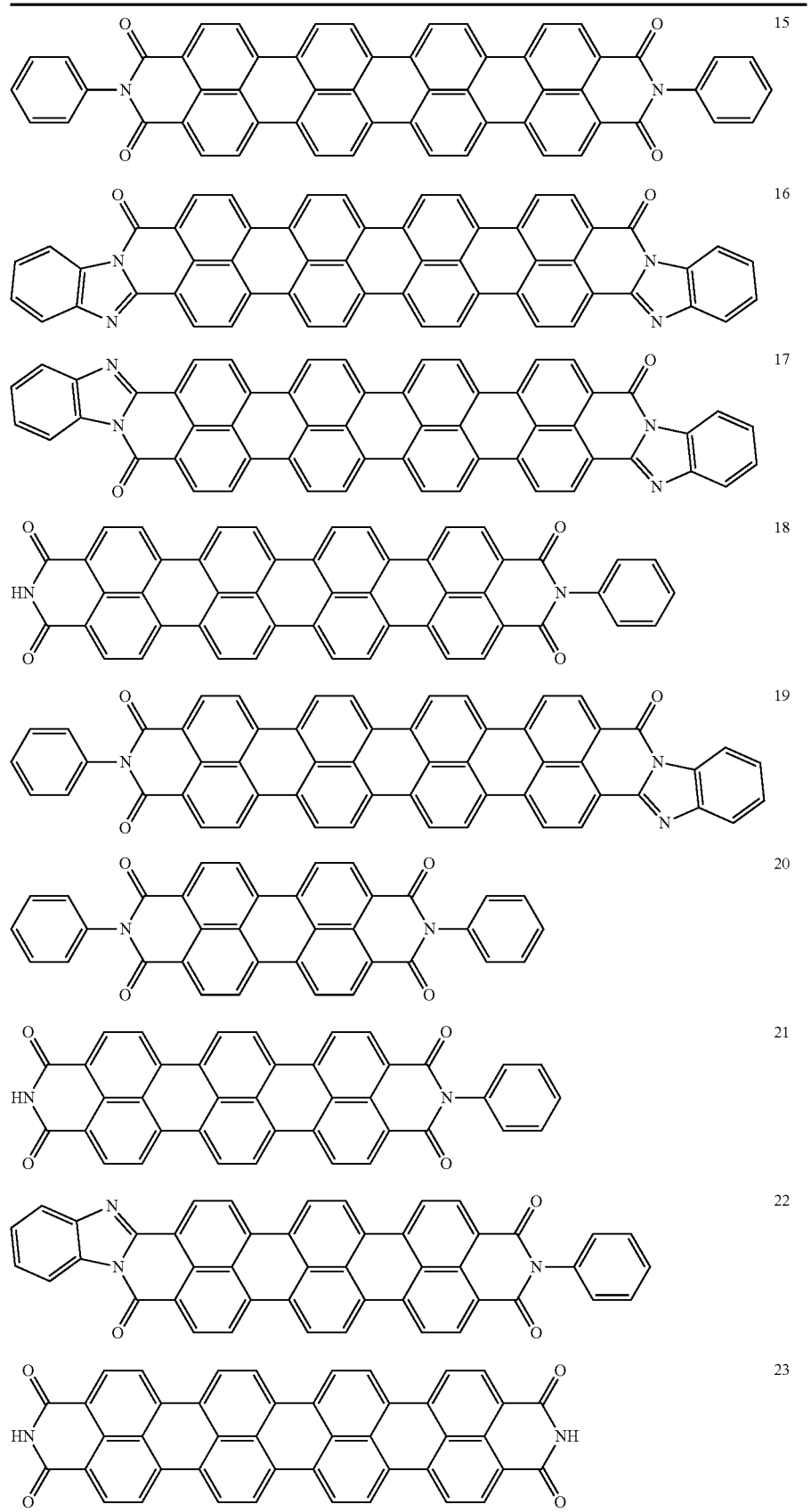

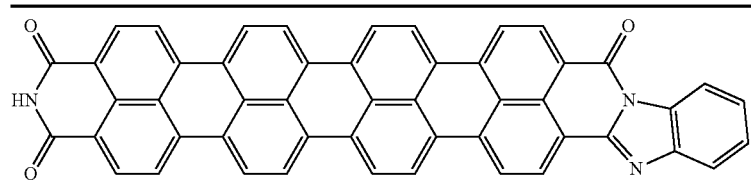
24.
13. A method according to claim 1, wherein said organic compound comprises anthrone fragments, having a general structural formula from the group comprising structures 25-35:
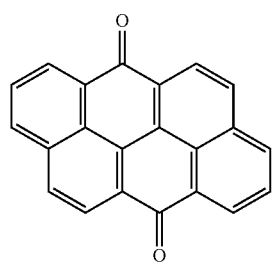
25
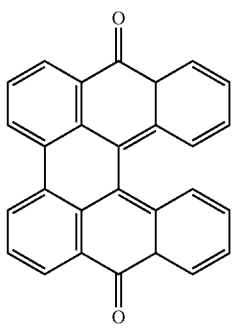
30
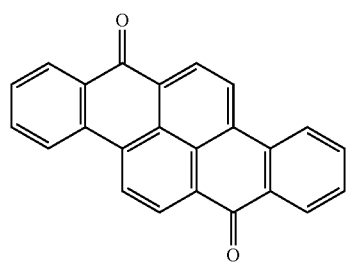
26
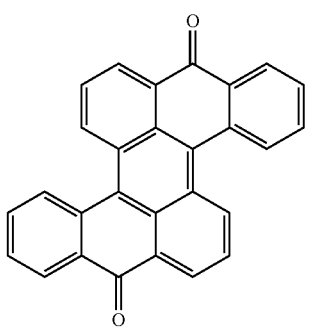
31
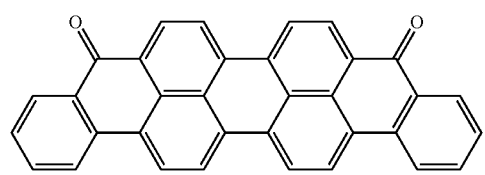
27
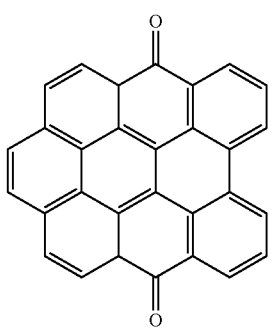
32
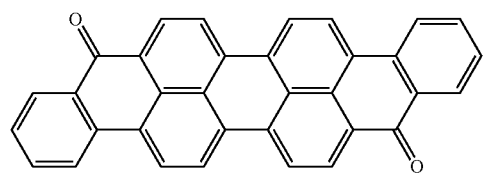
28
29
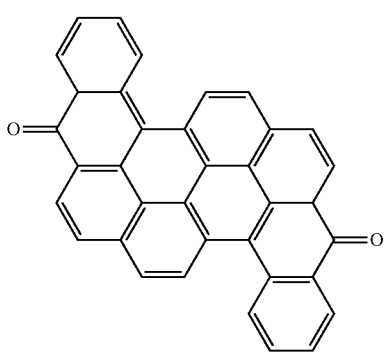
33

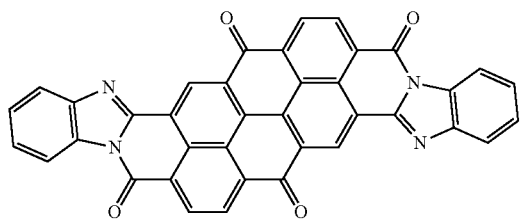

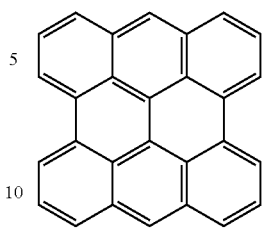

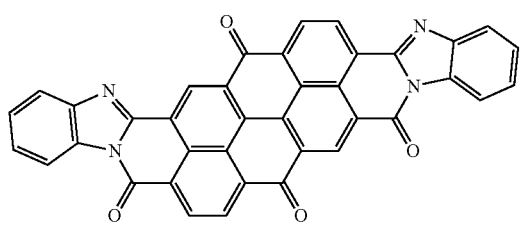

14. A method according to claim 1, wherein said organic compound comprises planar fused polycyclic hydrocarbons selected from the list comprising truxene, decacyclene, antanthrene, hexabenzotriphenylene, 1.2,3.4,5.6,7,8-tetra-(peri-naphthylene)-anthracene, dibenzoctacene, tetrabenzo-heptacene, peropyrene, hexabenzocoronene and having a general structural formula from the group comprising structures 36-45:

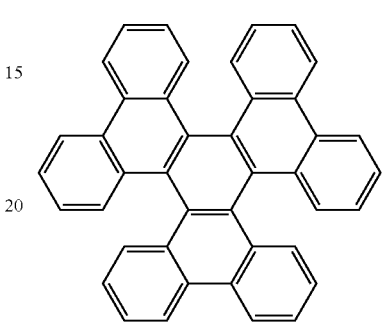

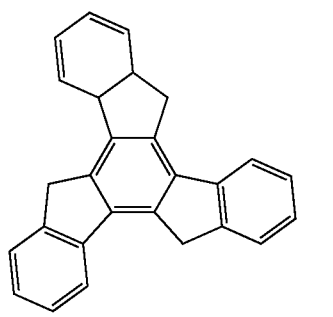

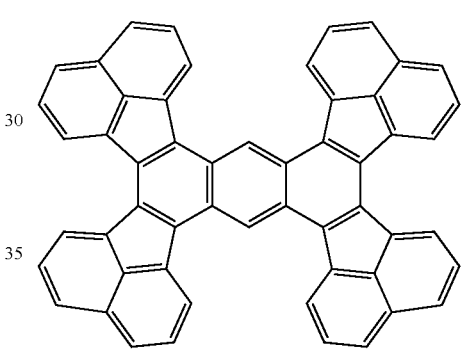

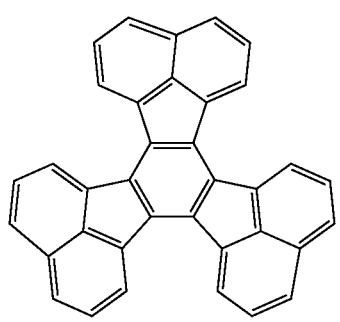

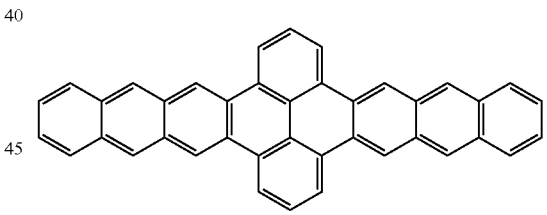

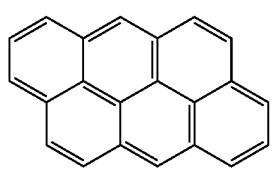

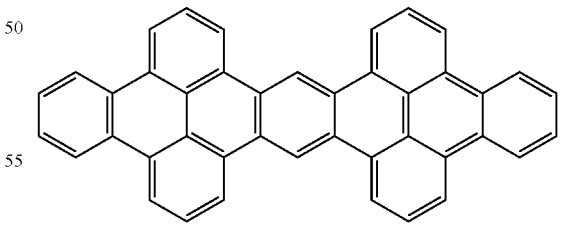

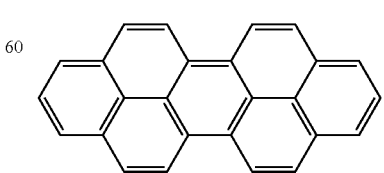

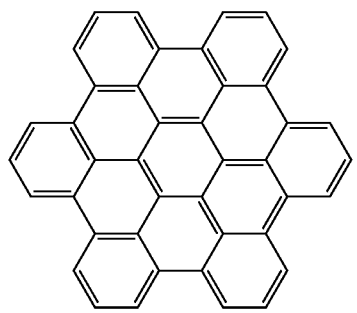

45.

15. A method according to claim 1, wherein said organic compound comprises coronene fragments, having a general structural formula from the group comprising structures 46-53:

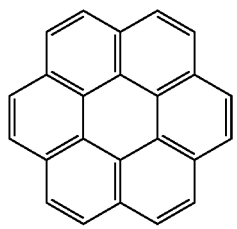

46

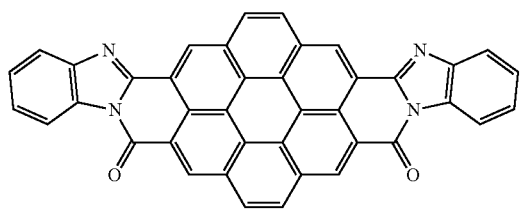

47

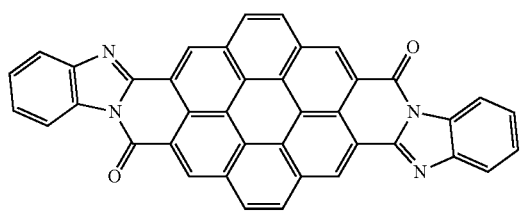

48

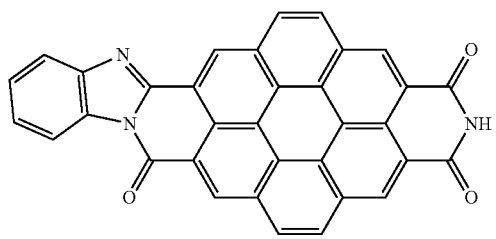

49

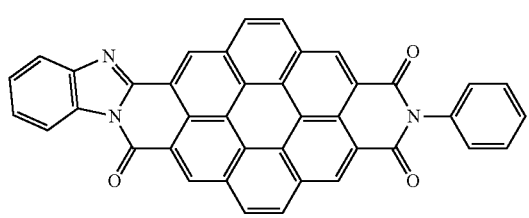

50

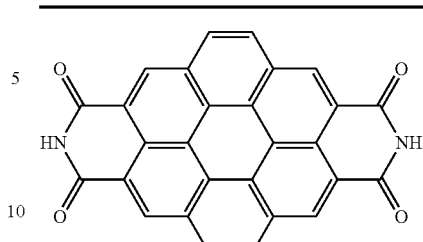

51

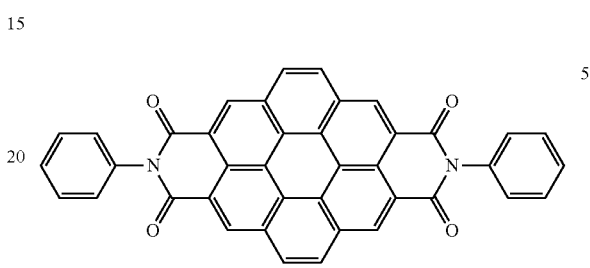

52

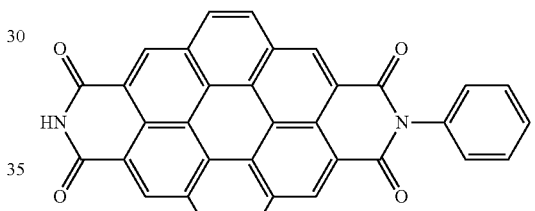

53.

16. A method according to claim 1, wherein said organic compound comprises naphthalene fragments, having a general structural formula from the group comprising structures 54-55:

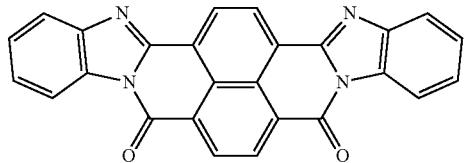

54

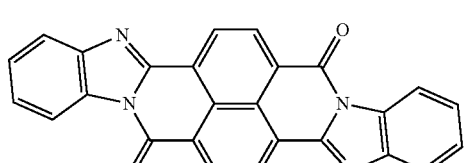

55.

17. A method according to claim 1, wherein said organic compound comprises pyrazine or/and imidazole fragments, having a general structural formula selected from the group comprising structures 56-61:

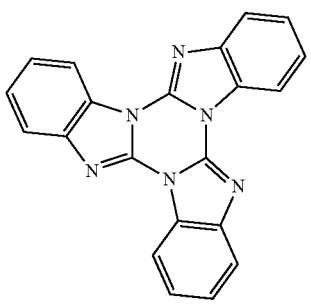
56

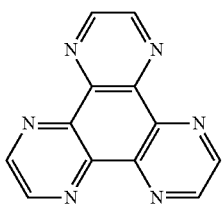
57

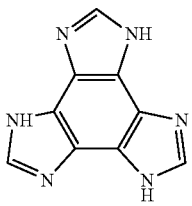
58

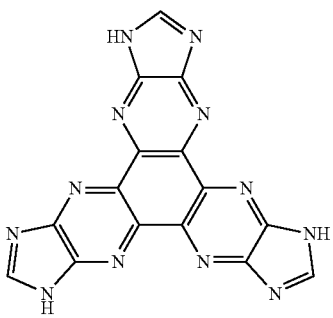
59

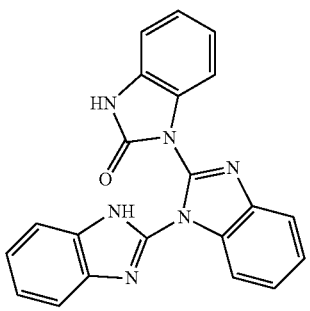
60

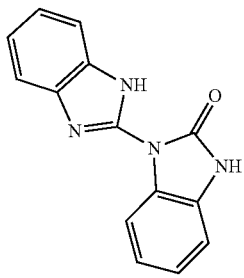
61.

18. A method according to claim 1, wherein said drying stage is carried out using airflow.

19. A method according to claim 1, wherein the substrate prior to the application of said solution is pretreated so as to render its surface hydrophilic.

20. A method according to claim 1, wherein said solution is isotropic or a lyotropic liquid crystal solution.

21. A method according to claim 1, further comprising an alignment action, wherein the alignment action is simultaneous or subsequent to the application of said solution on the substrate.

22. A method according to claim 1, wherein said application stage is carried out using a technique selected from the list comprising a spray-coating, Mayer rod technique, slot-die application, and printing.

23. A method according to claim 1, wherein the D-substituents further comprise molecular binding groups which number and arrangement provide for the formation of planar supramolecules from the organic compound molecules in the solution via non-covalent chemical bonds, wherein at least one binding group is selected from the list comprising a hydrogen acceptor (AH), a hydrogen donor (DH), and a group having the general structural formula

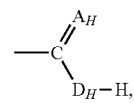

wherein the hydrogen acceptor (AH) and hydrogen donor (DH) are independently selected from the list comprising NH-group, and oxygen (O), and wherein at least one of the binding groups is selected from the list comprising hetero-atoms, COOH, SO$_3$H, H$_2$PO$_3$, NH, NH$_2$, CO, OH, NHR, NR, COOMe, CONH$_2$, CONHNH$_2$, SO$_2$NH$_2$, —SO$_2$—NH— SO$_2$—NH$_2$ and any combination thereof, where radical R is an alkyl group or an aryl group, the alkyl group having the general formula C$_n$H$2_{n+1}$- where n is 1, 2, 3 or 4, and the aryl group being selected from the group consisting of phenyl, benzyl and naphthyl, wherein the non-covalent chemical bonds are independently selected from the list comprising a single hydrogen bond, dipole-dipole interaction, cation-pi-interaction, Van-der-Waals interaction, coordination bond, ionic bond, ion-dipole interaction, multiple hydrogen bond, interaction via the hetero-atoms and any combination thereof, wherein the planar supramolecule have the form selected from the list comprising disk, plate, lamella, ribbon or any combination thereof, and wherein the planar supramolecules are predominantly oriented in the plane of the substrate.

24. A method according to claim 1, wherein the annealing is carried out in vacuum.

25. A method according to claim 1, wherein the pyrolysis temperature is in the range between approximately 150 and 450 degrees C.

26. A method according to claim 1, wherein the fusion temperature is in the range between approximately 500 and 800 degrees C.

27. A method according to claim 1, wherein the steps of the method of producing an anisotropic semiconductor film are repeated two or more times, and sequential solid layers are formed using solutions based on the same or different combinations of the organic compounds.

* * * * *